United States Patent [19]

Arimura

[11] Patent Number: 4,825,070
[45] Date of Patent: Apr. 25, 1989

[54] DISPLACEMENT DETECTOR FOR DETECTING AN AMOUNT OF DISPLACEMENT OF AN OBJECT TO BE MEASURED

[75] Inventor: Yoshiaki Arimura, Yokohama, Japan

[73] Assignee: Kabushiki Kaisha Toshiba, Kawasaki, Japan

[21] Appl. No.: 883,955

[22] Filed: Jul. 10, 1986

[30] Foreign Application Priority Data

Sep. 3, 1985 [JP] Japan .................. 60-193114
Sep. 3, 1985 [JP] Japan .................. 60-193113
Oct. 25, 1985 [JP] Japan .................. 60-237493
Nov. 8, 1985 [JP] Japan .................. 60-248894

[51] Int. Cl.⁴ .......................... G01D 5/34
[52] U.S. Cl. .................. 250/231 SE; 250/229; 250/551
[58] Field of Search ......... 250/231 SE, 237 G, 229, 250/551; 340/347 P; 356/395; 324/175

[56] References Cited

U.S. PATENT DOCUMENTS

| 4,304,630 | 12/1981 | Tanner | 250/231 SE |
| 4,308,500 | 12/1981 | Auins | 250/231 SE |
| 4,379,221 | 4/1983 | Avins et al. | 250/231 SE |
| 4,427,970 | 1/1984 | Devol | 340/347 P |
| 4,571,995 | 2/1986 | Timme | 250/231 P |
| 4,584,471 | 4/1986 | Gabriel | 250/237 G |
| 4,631,399 | 12/1986 | Ward | 250/229 |
| 4,631,539 | 12/1986 | Sanders et al. | 250/231 SE |
| 4,654,524 | 3/1987 | Kita | 250/231 SE |

FOREIGN PATENT DOCUMENTS 58-198718  11/1983  Japan .

OTHER PUBLICATIONS

"RO-64 Self-Scanned Circular Photodiode Array", Catalog of Reticon, by Reticon Corporation, 1974.

Primary Examiner—David C. Nelms
Attorney, Agent, or Firm—Foley & Lardner, Schwartz, Jeffery, Schwaab, Mack, Blumenthal & Evans

[57] ABSTRACT

A displacement detector in accordance with the present invention detects the amount of displacement of an object to be measured. Sensing means are arranged side by side with predetermined spacing whose states change in response to the changes in electromagnetic energy such as light energy, magnetic energy, and electrical energy. An electromagnetic energy generating means and an electromagnetic energy transmitting means that is linked to the motion of the object to be measured, transmits the electromagnetic energy from the electromagnetic energy generating means to the sensing means that is situated at the position that corresponds to the displacement of the object to be measured. A conversion unit ouputs the detection signal obtained from the sensing means as a displacement detection signal, by converting the detection signal to a coded signal that is characteristic of the position of the sensing means for the position where there was a change in the electromagnetic energy. A trouble shooting unit diagnoses malfunctions by examining whether or not the change in the displacement detection signal is within the range of specified values. A rotation number measuring unit counts the number of rotations of the object to be measured based on the detection signal from the sensing means, and a maximum value screening unit screens the maximum value from among the sensor outputs when the electromagnetic energy is incident upon a plurality of sensing means.

28 Claims, 19 Drawing Sheets

| MAGNETIC SENSOR  AMP. | 366-1 | 366-2 | 366-3 | 366-4 | 366-5 | 366-6 | 366-7 | 366-8 | ........ | 366-n-3 | 366-n-2 | 366-n-1 | 366-n |
|---|---|---|---|---|---|---|---|---|---|---|---|---|---|
| 378-1 | ↑ | ↓ | ↑ | ↓ | | | | | | | | | |
| 378-2 | | | ↓ | ↑ | ↓ | ↑ | | | | | | | |
| 378-3 | | | | | ↑ | ↓ | ↑ | ↓ | | | | | |
| 378-4 | | | | | | | ↓ | ↑ | | | | | |
| ⋮ | | | | | | | | | | | | | |
| 378-n-1 | | | | | | | | | | ↑ | ↓ | ↑ | ↓ |
| 378-n | ↓ | ↑ | | | | | | | | | | ↓ | ↑ | ial of the coded plate 10 has to be increased
DISPLACEMENT DETECTOR FOR DETECTING AN AMOUNT OF DISPLACEMENT OF AN OBJECT TO BE MEASURED

BACKGROUND OF THE INVENTION

1. Field of the Invention

The present invention relates to a displacement detector for detecting the amount of displacement in rotation, linear motion, or the like of an object to be measured, in particular, to a displacement detector which is capable of accurately detecting the amount of displacement in absolute value even under adverse circumstances.

2. Description of the Prior Art

Heretofore, in the rotary encoder which is a kind of displacement detector, the absolute value of the rotation angle of rotation shaft is obtained as a digital signal in the following manner. Namely, as shown in FIG. 1, a disk-shaped coded plate 10 having digital patterns that consist of slits or apertures, as indicated by hatches in the figure, at different radial positions corresponding to every predetermined central angles, is mounted coaxially on a rotation shaft 16 that is held with a bearing 14 by a case 12 indicated by the single-chained line in the figure. Then, the absolute value of the coded angle of rotation of the rotation shaft 16 is obtained as a digital signal in a detection unit 18, by irradiating the digital patterns with a light source from one side of the coded plates 10 and by detecting the transmitted light with an optical sensor. In order to improve the resolving power of the rotation angle that is detected by such a rotary encoder, it is necessary to increase the number of digits of the digital patterns so that it leads to a problem that the diameter of the coded plate 10 has to be increased and the size of the device has to be made large, resulting in a higher cost for the product. Further, when the number of digits are increased by arranging the digital patterns closely in the radial direction, there is required a higher finishing precision for the light source or the optical sensor in the detection unit 18.

Moreover, the digital patterns in the existing rotary encoder as in the above are composed of Gray code. However, no special measures are being taken regarding possible failure of the device. Now, in an encoder in which a plurality of sensors are arranged in a line with predetermined spacings, for outputting a detection signal that corresponds to the position of the object to be measured that moves along the line, and for converting the detection signal that is output from the sensor to a corresponding individual code, use is made of numerous circuit elements, so that there exists a problem that the probability of failure of the device is accordingly high. This necessitates then the provision of a failure diagnosing means for checking whether or not the device is operating normally.

SUMMARY OF THE INVENTION

An object of the present invention is to provide a small-sized displacement detector which is capable of rapidly detecting the absolute position of displacement with high precision.

Another object of the present invention is to provide a small-sized displacement detector which is capable of detecting the absolute value of the displaced position with high precision even under adverse circumstances.

Another object of the present invention is to provide a displacement detector which is capable of checking whether or not the device is operating normally, and outputting a malfunction signal in case there an abnormality is detected.

According to one aspect of the present invention, a displacement detector for detecting the displaced amount of the object to be measured includes a plurality of light-receiving elements that are arranged in line in a desired region, a light source which illuminates the light-receiving elements while moving along the line of the light-receiving elements, and a signal processing unit that outputs a digital signal which is characteristic to the light-receiving element that receives light from the light source. The signal processing unit includes a trouble shooting unit for diagnosing a fault by checking whether or not the change in the displacement detection signal is within a predetermined range, a rotation counting unit for counting the number of rotations of the object to be measured based on the detection signal from the light-receiving element, and a maximum value screening unit for screening a maximum sensor output when light is incident upon a plurality of light-receiving elements.

Another aspect of the present invention is that the displacement detector for detecting the displacement of an object to be measured includes a plurality of light-emitting elements that are arranged side by side with predetermined spacing in a desired region, a flashing circuit for outputting in turn a signal that is characteristic to the light-emitting element that was flashed, light-detecting elements for detecting light which comes from the light-emitting element, by moving along the row of the light-emitting elements, and a means for outputting to the outside the signal that is output in turn from the flashing circuit, corresponding to the detection signal from the light-emitting element.

Another aspect of the present invention is that the displacement detector for detecting the displacement of an object to be measured includes a plurality of magnetic sensors, with a function that changes their states in response to the changes in the magnetic flux, that are arranged side by side with predetermined spacing, a magnetic flux varying means which is arranged to be movable along the line of the magnetic sensors and is capable of varying the magnetic flux in response to the position of displacement of the object to be measured, and a displacement detection signal means for outputting a displacement detection signal by converting the detection signal, that is obtained from the magnetic sensor situated at the position where the magnetic flux is varied by means of the magnetic flux varying means, to a coded signal which is characteristic to the position of the magnetic sensor.

Another aspect of the present invention is that the displacement detector for detecting the displacement of an object to be measured includes a plurality of electrical conductors that are arranged side by side with predetermined spacing, an alternating electrical field application means which is arranged to be movable along the line of the electrical conductors, and applies alternating electric field supplied from an alternating power source in response to the change in the position of the object to be measured, and a displacement detection signal means for outputting a displacement detection signal by converting the detected signal, that is obtained from the electrical conductor that is situated at the position to which the alternating electric field is applied by the alternating electric field application means, to a characteristic coded signal that corresponds to the position of the electrical conductor.

These and other objects, features and advantages of the present invention will be more apparent from the following description of the preferred embodiments, taken in conjunction with the accompanying drawings.

DESCRIPTION OF THE PREFERRED EMBODIMENTS

Figure 1:
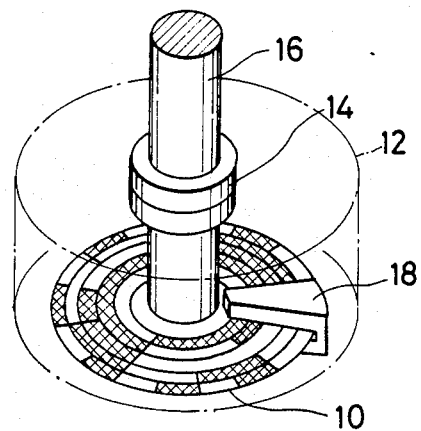
FIG. 1 is a perspective view of a prior art rotary encoder.
Figure 2:
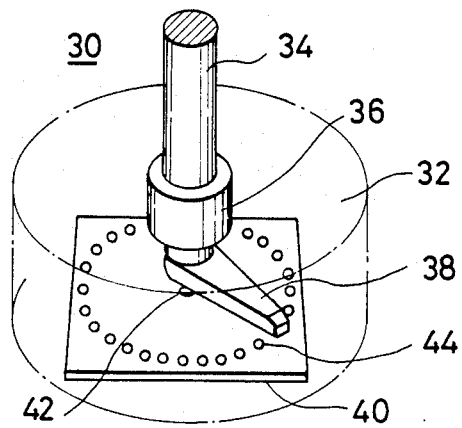
FIG. 2 is a perspective view of an example in which the present invention is applied to a rotary encoder.
Figure 3:
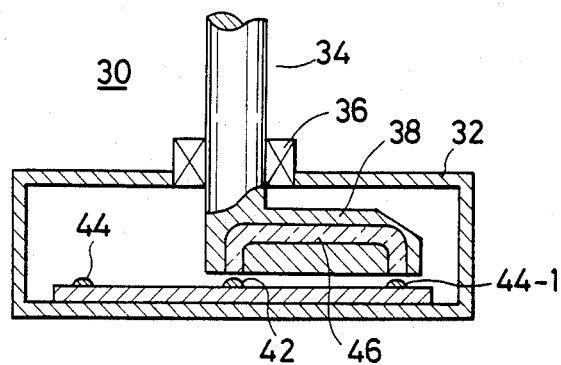
FIG. 3 is a cross-sectional view of the rotary encoder shown in FIG. 2.

Referring to FIGS. 2 and 3, a first example of embodying the present invention to the rotary encoder is shown with reference numeral 30.

As shown in FIG. 2, according to the present invention, on the plane on one end of a case 32 consisting of a cylindrical shell that is shown by a singlechained line in the figure, a rotation shaft 34 perpendicular to the above plane that rotates coaxially with the rotation shaft of the object to be measured is inserted to the case 32 so as to be held by the case 32 by means of a bearing 36. On the tip of the rotation shaft 34 in the case 32 there is fixed a rotating member 38 whose one end is supported by the rotation shaft 34 and whose the other end rotates around the axis center of the rotation shaft 34. On the other end plane of the case 32 there is laid a semiconductor chip 40 that serves as a base. At the portion where the rotation shaft 34 intersects with the semiconductor chip 40 there is arranged a light-emitting diode 42 that works as a light source. On the semiconductor chip 40 a plurality of photodiode 44-1, . . . , and 44-n that serve as light-emitting elements are arranged so as to be positioned below the other end of the rotating member 38, on the circumference of a circle with the 1-emitting diode 42 as the center. That is, there is arranged an optical fiber 46 with the disposition as indicated in FIG. 3, on the bottom on the semiconductor 40 side of the rotating member 38. Light emitted from the light-emitting diode 42 impinges through the optical fiber 46 upon one of the photodiode, 44-1. The detection signal from the photodiode 44-1 which received light as in the above, is converted to a characteristic digital signal by means of a signal processing circuit (not shown in FIG. 2) formed on the semiconductor chip 40 as a conversion means. Accordingly, it becomes possible to obtain the absolute value of the rotation angle of the rotation shaft 34 from the characteristic digital signal.

Next, referring to FIG. 4, the signal processing circuit 52 will be described. On the semiconductor chip 40 the light-emitting diode 42 is lighted by being connected to a power source 54 via a resistance 56. Light emitted from the light-emitting diode 42 is led by the optical fiber 46, and is detected by the photodiode 44. The photodiode 44-1 which received light becomes conducting, and short-circuits a resistor 62 connected in series to a DC power source 60 to the ground 64. The output current generated in turning on or turning-off of each of the photodiodes 44 is amplified by amplifiers 66-1, 66-2, ..., and 66-n. The DC power source 60 is then short-circuited to the ground 64 by the diode groups 68-1, 68-2, ..., and 68-n that are surrounded in the figure by single-chained lines that generate signals that are characteristic to each of the photodiodes 44, via the load resistances 70-1, 70-2, ..., and 70-n that are connected in series to the DC power source 60 and the photo-Darlington 58 that is turned on. The load resistors 70-1, 70-2, ..., and 70-n are connected to the NOT circuits 72-1, 72-2, ..., and 72-n, respectively, and the negative logic output obtained from the short-circuited load resistors 70 is inverted to a positive logic output signal by means of the NOT circuits 72. Next, by citing a concrete example, the circumstance will be described in which a digital signal characteristic to each photodiode 44 is output from the circuit mentioned above.

As the rotation shaft 34 is rotated accompanying the rotating member 38, interlocked with the rotation of the object to be measured, the rotating member 38 is rotated within the case 32 with the rotation shaft 34 as the center, at the position facing the semiconductor chip 40. The light which is output from the light-emitting diode 42 irradiates in turn the individual photodiodes 44 that are arranged on the circumference, by means of the reflecting surfaces 48 and 50 of the prism fixed to the rotating member 38. For example, if the rotation of the rotating member 38 is stopped and the photodiode 44-1 detects light, then the photodiode 44-1 becomes conducting and short-circuits the resistor 62 to the ground 64. Then, the output current obtained due to the conduction of the photodiode 44-1, is further amplified by the amplifier 66-1, and short-circuits the load resistors 70-1, 70-2, ..., and 70-n to the ground 64 via the diode group 68-1. In this case, signals "010 ... 0" are sent to the NOT circuits 72-1, 72-2, and 72-n as respective negative logic inputs. The NOT circuits 72 output the positive logic signals "101 ... 1" by inverting these negative logic signals. In the present embodiment, the digits of the digital signals for the NOT circuits 72-1, 72-2, 72-3, ..., and 72-n are set to be those of $2^0$, $2^1$, $2^2$, ..., and $2^n$, so that the positive logic signals in the above are output as respectively "1 ... 101".

Next, referring to FIG. 5, a modification to the signal processing circuit in the first embodiment shown in FIG. 2 will be described. The circuit 74 for this embodiment includes the function for obtaining the absolute value of the rotation angle of the rotation shaft 34 by converting the detection signal at a photodiode 44-1 to a digital signal that is characteristic to it. In addition, the circuit 74 has a function for diagnosing failure by examining whether or not the change in the output is within the range of a predetermined values. For this purpose there is added a trouble shooting unit 76 to the circuit for the embodiment shown in FIG. 4. The trouble shooting unit 76 comprises a register 78 for memorizing the digital signals from the NOT circuits 72-1, 72-2, ..., and 72-n, an EXCLUSIVE-OR circuit 80 for comparing the values for the previous state from the register 78 and the values for the present digital signals from the NOT circuits 72, and for taking logical difference between them, load register 82-1, 82-2, 82-3, ..., 82-n with the same weight for D/A converting the output from the EXCLUSIVE-OR circuit 80, and a comparator 84 for comparing the DC voltage from the load resistor 82-1, 82-2, 82-3, ..., 82-n and the voltage from a voltage generating source 86 in one digit.

Namely, the comparator 84 outputs a malfunction signal 88 if the DC voltage $e_d$ is the threshold value that is set in the DC voltage generating source 86 and the DC voltage corresponding to the output signal for one of the EXCLUSIVE-OR circuit 80 is larger than $e_d$.

Next, the operation of the trouble shooting unit 76 will be described.

In order to examine whether or not the digital signal that is output from the NOT circuit 72 is normal, one needs only to compare the value that is now being output and the value of the digital signal that was output prior to the present value, and to examine whether there is a change in just one digit in all of the digits of the digital signal. Namely, the previous digital signal is kept stored in the register 78, and logical difference is taken with the digital signal that is output later in the EXCLUSIVE-OR circuit 80. The EXCLUSIVE-OR circuit 80 generates an output signal if there is a difference between the two values.

This signal is input to the clock terminal 78-1 of the register 78 to clear the value for the previous value and memorize the present value.

Now, if the digital signals that are output from the NOT circuits 72-n are outputs of Gray code, then the digital signals that are output continuously are output with a change in one of the total digits without fail. Namely, the numbers 31 and 32 in the decimal code are represented by "010000" and "110000", respectively. Because of this, when normal digital signals are output continuously, there always exists an output signal from one of the EXCLUSIVE-OR circuits 80. Accordingly, the DC voltage $e_d$ becomes lower than the threshold value for the voltage generating source 86 so that there will be no output of a malfunction signal 88 from the comparator 84. However, if an abnormal digital is output due to malfunction, the DC voltage $e_d$ becomes greater than the threshold value of the voltage generating source 86, and a malfunction signal 88 is output from the comparator 84.

In this way, whether or not the output digital signal is normal can be judged by the presence or absence of such a malfunction signal 88. In addition, it should be noted here that the output signal 90 of the OR circuit 89 may be used as a relative angle signal.

Figure 6:
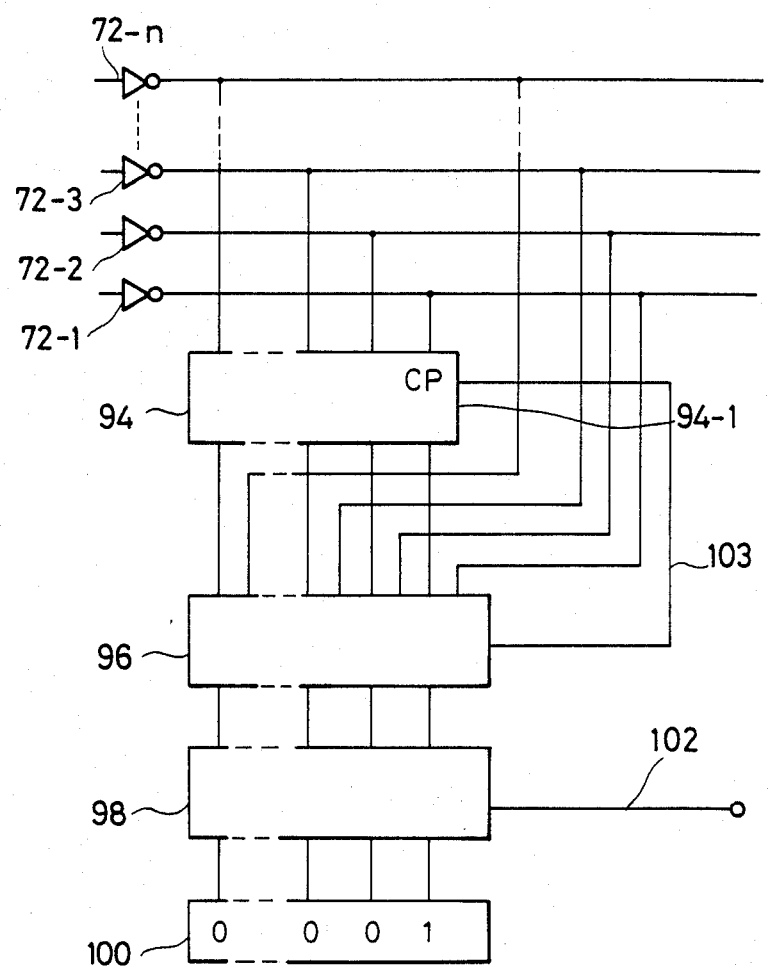
FIG. 6 is a circuit diagram for a modification to the trouble shooting unit of the signal processing circuit shown in FIG. 5.

By changing the connecting conditions of the diodes in the diode groups 68-1, 68-2, ..., and 68-n, it becomes possible to change the digital signals that are output from the NOT circuits 72-n into outputs in binary code. To do this, as shown in FIG. 6, the n-bit binary data that is output from the NOT circuits 72 is recorded first in a register 94 in order to judge whether or not the output binary digital signal data is correct. Then, the data in the register 94 and the binary data that immediately follows the memorized data are subtracted in a subtraction circuit 96. The absolute value of the difference is compared with the numerical value "0 . . . 001" of set point 100 in a comparator 98.

If the result of the comparison is greater than "1", it is output as a malfunction signal 102. If the difference in the subtraction circuit 96 is less than "1", a signal 103 is output to be input to CP 94-1 of the register 94. The n-bit binary data recorded in the register 94 is rewritten by the binary data that follows it immediately, and the result is memorized. Then, the correctness of the digital signal that is output next is judged in similar manner.

Figure 7:
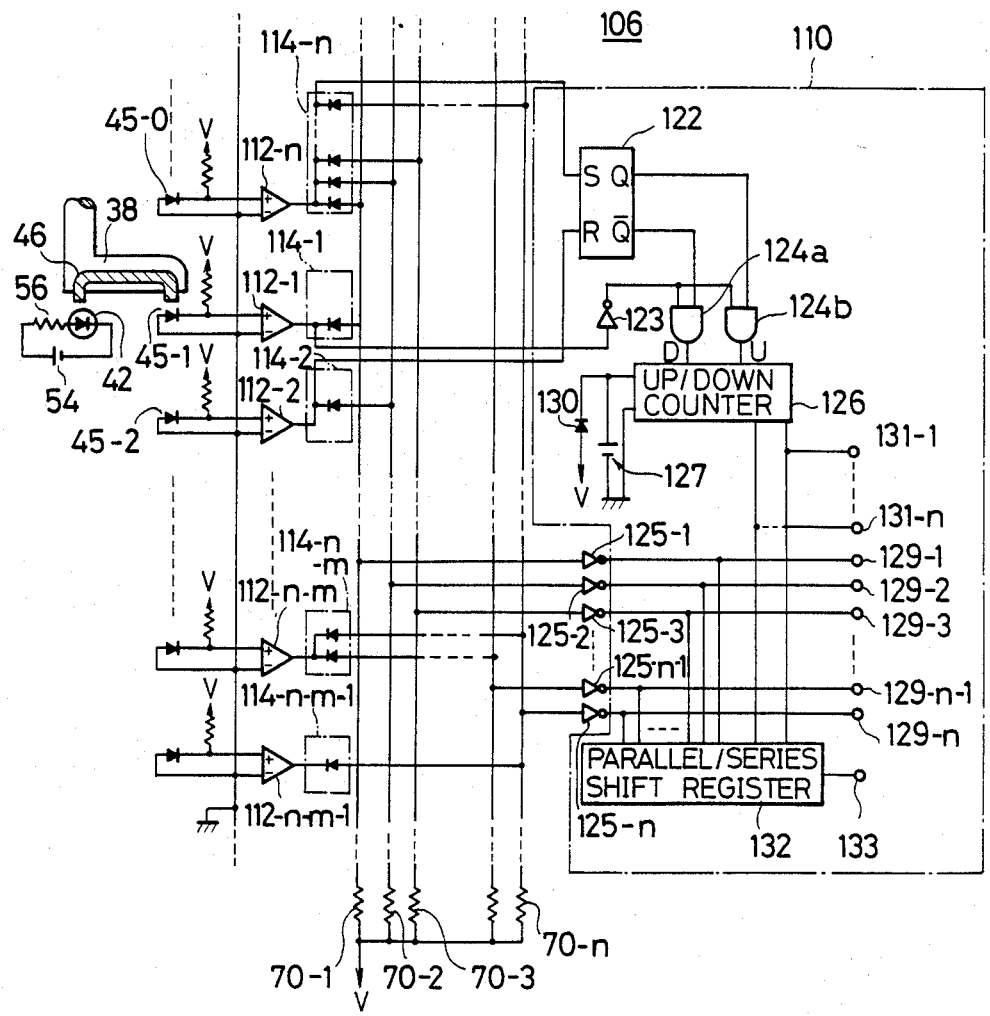
FIG. 7 is a circuit diagram for a modification to the signal processing circuit shown in FIG. 4 that includes a rotation number counting function.

As in the above, by comparing the data before and after change of the output signal, it becomes possible to determine whether or not the displacement detector is operating normally Next, by referring to FIG. 7, a modification to the signal processing circuit in the first embodiment shown in FIG. 4 will be described. The circuit 106 for the modification is obtained by adding a rotation number measuring unit 110 for counting the number of rotations of the rotation shaft 34, to a conversion circuit 108 that has a function which is similar to the signal processing circuit shown in FIG. 4. The conversion circuit 108 comprises amplifiers 112-1, 112-2, . . . , and 112-n for amplifying the output circuits obtained by turning on specified photodiodes 45 that are similar to the above embodiment, diode groups 114-1, 114-2, . . . , and 114-n for generating signals characteristic to each of the photodiodes 45, based on the outputs from the amplifiers 112, a DC power source (not shown) that is connected in series to the diode groups 114 via the load resistors (not shown), and the NOT circuits 125-1, 125-2, and 125-n for inverting the output from each of the load resistors that are short-circuited via the diode groups 114. The operation of the conversion unit 108 is similar to the above embodiment so that further description will be omitted.

In the rotation number unit 110, noninverting amplifiers 112-1, 112-2, . . . , and 112-n are selected out of noninverting amplifiers 112-1, 112-2, . . . , and 112-n. The output terminal of the noninverting amplifier 112-n is connected to the set terminal S of a flip-flop circuit 122 and the output terminal of the noninverting amplifier 112-2 is connected to the reset terminal R of the flip-flop circuit 122. The output Q of the flip-flop circuit 122 and the output signal of the noninverting amplifier 112-1 that is obtained via an inverter 123 are ANDed in an AND circuit 124a. In addition, the output of the flip-flop circuit 122 and the output signal of the noninverting amplifier 112-1 obtained via the inverter 123 are ANDed in an AND circuit 124b. The output terminals of each of the AND circuits 124a and 124b are connected respectively to an UP/DOWN counter 126 which is supplied power and driver via a diode 130 from the DC power source V. The DOWN terminal D and the UP terminal U are connected to the AND circuits 124a and 124b, respectively.

The UP/DOWN counter 126 is charged by the DC power source V during normal operation, and is equipped with a battery unit 127 which is a back-up battery that supplies a current to the UP/DOWN counter 126 at the time of disconnection of the DC power source V. Namely, a diode 130 prevents the reverse flow of the current that is discharged by the battery 127 to the side of the DC power V. The power source of the UP/DOWN counter 126 is always backed up by the battery 127 so that the counted value is held even during the time of disconnection of the DC power V. In FIG. 7, the variable m represents an arbitrary natural number The output signals of NOT circuits 125-1, 125-2, . . . , and 125-n and the UP/DOWN counter 126 are output as parallel signals respectively from the output terminals 129-1, 129-2, 129-3, . . . , 129-(n−1), and 129-n and from the output terminals 131-1, 131-2, . . . , and 131-n. At the same time, the outputs of the NOT circuits 125-1, 125-2, . . . , and 125-n and the UP/DOWN counter 126 are input to a parallel/series shift register 132, and are output from a terminal 133 as series signals Next, the counting operation of the rotation number measuring unit 110 will be described If a photodiode 45-0 which is connected to the noninverting amplifier 112-n in FIG. 7, among photodiodes 45 that detect light from the optical fiber 46, due to the rotation in positive direction of the object to be detected, receives light, the noninverting amplifier 112-n outputs a "0" signal which is input to the flip-flop circuit 122. The flip-flop circuit 122 is set by this input, and its output Q becomes "1" level and the output $\overline{Q}$ becomes "0" level. Further, if the photodiode 45-1 detects light, the inverter 123 outputs a "1" signal which is input to the AND circuit 124b. The AND circuit 124b takes the AND operation of the "1" level signal which is the Q output of the flip-flop circuit 122 and the signal "1" of the inverter 123 to supply a signal "1" to the UP terminal of the UP/DOWN counter 126, increasing the counted value by one. Next, if the photodiode 45-2 detects light, the noninverting amplifier 122-2 outputs a signal "0" which resets the flip-flop circuit 122, leading to "0" level for the output Q and "1" level for the output $\overline{Q}$. After this, if the object to be measured further continues rotation in the positive direction and the irradiation of light continues from photodiode 45-0 to the photodiode 45-2 through the optical fiber 46, the counted value by the UP/DOWN counter 126 is similarly increased by one.

When the object to be measured is rotated in the reverse direction, the photodiode 45-2 detects light first and outputs a signal "0". This resets the flip-flop circuit 122, and the output Q becomes "0" level while the output $\overline{Q}$ becomes "1" level. Further, if the photodiode 45-1 detects light and the noninverting amplifier 112 outputs a "0" signal, the AND circuit 124a takes the AND operation of the "1" level which is the output $\overline{Q}$ of the flip-flop circuit 126 and the "1" signal of the inverter 123, supplies a "1" signal to the DOWN terminal of the UP/DOWN counter 126, and decreases the counted value by one. Moreover, if the photodiode 45-n detects light, the noninverting amplifier 112-n outputs signal "0" to set the flip-flop circuit 122, giving rise to "1" level for the output Q and "0" level for the output Q. After this, if the object to be measured further continues to be rotated in the reverse direction and light continues to irradiate the photodiode 45-0 from the photodiode 45-n through the optical fiber, the counted value by the UP/DOWN counter 122 is decreased similarly by one.

The counted value of the UP/DOWN counter 126 can be obtained from the output terminals 131-1, 131-2, . . . , and 131-n. For instance, if the counted value is "12" in decimal code and if it is output as a Gray code with 16 bits, the rotation number signal obtained will be "0000000000001010." The rotation number signal and the angle signal are obtainable as parallel signals from the output terminals 131-1, 131-2, ..., and 131-n and the output terminals 129-1, 129-2, ..., and 129-n, respectively. Further, as need arises, these signals may also be obtained from an output terminal 133 after converted to series signals in a shift register 132.

In the rotary encoder shown in the present embodiment, when the power source V is disconnected and then turned on again, there will arise no problem in the angle signal because it is measuring the absolute value for all times. However, when the power source V is disconnected, the UP/DOWN counter 126 loses its counted value and the measured value of the rotation number with nothing to be reproduced. In order prevent this drawback, a battery (for example, a lithium battery) 127 is incorporated on the terminal of power source V for the UP/DOWN counter 126, and when the power source V is disconnected, the UP/DOWN counter 126 alone is arranged to be operated by preventing the reverse flow of the current in the battery 127.

As described in the foregoing, by incorporating a rotation number measuring circuit in a rotary encoder which can detect the angle signal in absolute value, and in addition, by backing up the counter in the measuring circuit, it becomes possible to prevent the disappearance of the rotation number due to disconnection of the power source.

In the present embodiment, the measurement of the rotation number was carried out by processing the detected signal of photodiodes. However it may also be done by processing the output of the encoder, namely, the angle signal. In this case, if signals for detecting three consecutive photodiodes are formed in the decoder from the angle signal, subsequent processing will become realizable by applying the composition of the embodiment described in the foregoing.

By referring to FIG. 8, another modification to the signal processing circuit in the first embodiment shown in FIG. 4 will be described. The circuit 134 for this modification is obtained by adding a maximum value selection unit 136 that selects the maximum value of the sensor outputs in the case when light is incident upon a plurality of photodiodes, to a conversion circuit which is similar to the conversion circuit shown in FIG. 7. The maximum value selection unit 136 comprises comparators 138-1, 138-2, ..., and 138-n that compare the outputs of the respective pairs of adjacent photodiodes, inverters 140-1, 140-2, ..., and 140-n for inverting the outputs of two adjacent comparators in the preceding stage, and NAND circuits 142-1, 142-2, ..., and 142-n for taking the NAND operation between the output from the comparator 138 and the output from the inverter 140.

Figure 8:
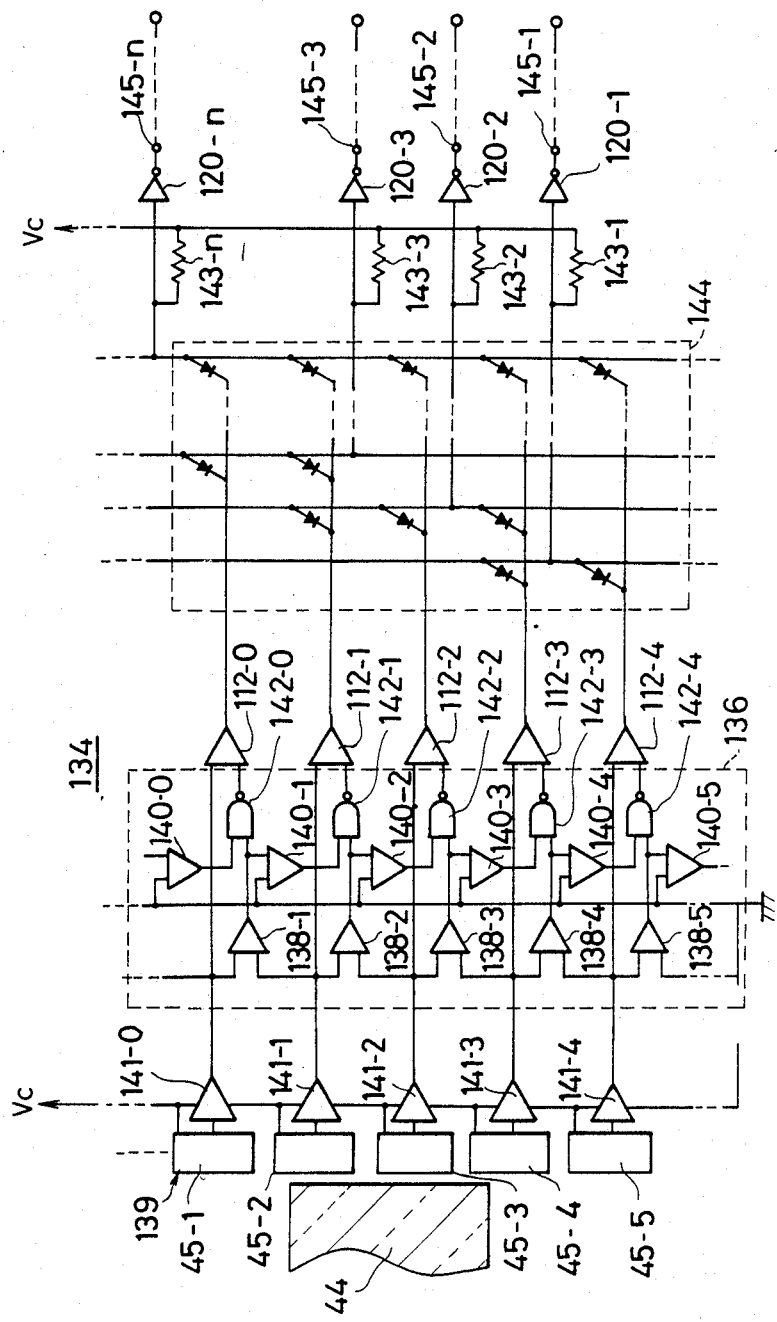
FIG. 8 is a circuit diagram for a modification to the signal processing circuit shown in FIG. 4 that includes a maximum value screening function.

Referring to FIG. 8, the operation of the maximum value selection unit 136 will be described. As shown in FIG. 8, light emitted from the light-emitting diode is transmitted by an optical fiber 44 fixed to the rotating member and is detected by the photodiode that is situated at the position that faces the tip of the rotating member. The light-receiving array 139 of the irradiated photodiode 45 becomes on condition, and a current flows from the DC power source Vc to a linear amplifier 141 via the light-receiving array 139 and is amplified. The linear amplifier 141 is provided for each of the photodiodes 45 and power is supplied by the DC power source Vc. The output signal of each of the linear amplifiers 141 is input along with the output signal of another linear amplifier 141 that correspond to the adjacently situated photodiode 45, to the two input terminals A and B of the comparators 138.

A comparator 138 compares the intensities of the output signals from each of the linear amplifiers that are input to the input terminals A and B. If the signal that is input to the terminal A is stronger than that input to the input terminal B, the comparator 138 outputs a positive voltage, and if the signal that is input to the input terminal B is stronger than that input to the input terminal A, it outputs a negative voltage. The output signal from each of the comparators 138 is inverted by an inversion amplifier 140 that is provided for each of the comparator 138. The output signal of each of the inverting amplifier 140 is taken the NAND operation in a NAND circuit 142, with the output signal of a comparator 138 whose input terminal A is connected to the output terminal of a linear amplifier 141 that is connected to the input terminal B of a comparator 138 that is connected to the inverting amplifier 140 in question. The output signal of the NAND circuit 142 is input to the control terminal of the amplifier 112 that is provided for each of the NAND circuits 142. If signal "0" is input to this control terminal from a NAND circuit 142, the amplifier opens the gate and outputs the signal that is input from the linear amplifier 141 by inverting it.

The output terminal of each of the amplifiers 112 is connected, via diodes 144 whose anode side is connected to each of the load resistors, to predetermined load resistors 143 out of the n load resistors 143 that are connected to the DC power source Vc, in a connection condition which is different for each amplifier 112. When the output voltage of an amplifier 112 becomes less than 0, the load resistor 143 that is connected to the amplifier 112 via diodes 144 is short-circuited to the ground that is built-in but not shown in the amplifier 112. One end of the load resistor 143 whose other end is connected to the DC power source Vc is connected to the input terminal of each of the NOT circuits 120. After the negative logic signals that are obtained in short-circuiting of the load resistors 143 are input to the NOT circuits 120, and the negative logic signals are inverted to positive logic signals and are output from each of the terminals 145-1, 145-2, ..., and 145-n.

Further, in the present embodiment, diodes 144 are connected between each of the load resistors 143 and each of the amplifiers 112, in such a way as to have the positive logic signals that are output from each of the terminals 145-1, 145-2, ..., and 145-n are obtained in accordance with Gray code that is assigned to each of the photodiodes 45.

Here, if the rotation of the rotating member is stopped and photodiodes, for example, 45-1, 45-2, and 45-3 detect light, then each of the photodiodes 45-1, 45-2, and 45-3 is brought to the on-state, so that currents are input from the DC power source Vc to each of the linear amplifiers 114-1, 114-2, and 114-3 via each of the light-receiving arrays 139. The output signals of each of the linear amplifiers 141-1, 141-2, and 141-3 are input to the input terminal A of the respective comparators 138-2, 138-3, and 138-4, as well as to the input terminal B of the respective comparators 138-1, 138-2, and 138-3. To the input terminal A of the comparator 138-1 there is input the output signal of the linear amplifier 141-0 to which is connected the photodiode 45-1 which is not detecting light. Since the light-receiving area of the light-receiving array 139 of the photodiode 45-2 is greater than that of the photodiode 45-1, the value of the current output from the linear amplifier 45-2 exceeds that of the linear amplifier 45-1. Then, the current value that is input to the input terminal A of the comparator 138-1 is smaller than the current value input to the input terminal B of the same comparator, so that there is output a negative voltage from the comparator 138-1. Similarly, the light-receiving area of the light-receiving array 139 of the photodiode 45-3 is greater than that of the photodiode 45-2, so that the comparator 138-2 outputs a negative voltage. Further, the light-receiving area of the light-receiving array 139 of the photodiode 45-3 is greater than that of the photodiode 45-4, and the light-receiving area of the light-receiving array 139 of the photodiode 45-4 is greater than that of the photodiode 45-5, so that both of the comparators 138-3 and 138-4 output positive voltage.

For comparators 138 other than the comparators 138-1, 138-2, 138-3, and 138-4, the current values that are input to both of the input terminals A and B are in balance, so that there will be output neither positive nor negative voltage from these comparators. The inverting amplifier 140-2 which receives a negative voltage from the comparator 138-2 outputs a positive voltage which is input to the NAND circuit 142-2. The NAND circuit 142-2 takes the NAND operation of the positive voltage that is output from the comparator 138-2 and the positive voltage output from the inverting amplifier 140-2, and outputs "0" signal. The amplifier 112-2 receives "0" signal that is output by the NAND circuit 142-2, in its control terminal. Therefore, it opens its gate, inverts the output signal that consists of a positive voltage from the linear amplifier 141-2, and gives rise to a negative voltage on its output terminal side. In the load resistors 143-2 and 143-n, out of 143-1, 143-2, . . . , and 143-n, that are connected to the amplifier 112-2 via the diodes 144, there flow currents from the DC power source Vc. However, in the rest of the load resistors 143 there will flow no current from the DC power source Vc since they are not connected to the amplifier 112-2 via the diodes 144. Therefore, to the NOT circuits 120 there are input negative logic signals of "1, 0, 1, . . . , 0" corresponding to the respective NOT circuits of 120-1, 120-2, 120-3, . . . , and 120-n. Each of the NOT circuits 120 inverts the negative logic signal "1, 0, 1, . . . , 0" to a positive logic signal "0, 1, 0, . . . , 1", and outputs the corresponding result from each of the terminals 145-1, 145-2, 145-3, . . . , and 145-n. Moreover, the amplifiers 112 except for the amplifier 112-2 all have an output signal "1" for the NAND circuits 142 that are connected to their control terminals so that their gates are not opened and hence the output signals of these amplifiers have all positive voltages. Accordingly, none of the amplifiers other than the amplifier 112-2 will short-circuit the load resistors.

As in the above, in the rotary encoder of the present embodiment, it is possible to select a photodiode which receives light most, even when the output light that is irradiated by the optical fiber 44 is not concentrated to a single photodiode 45 and extends over more than two photodiodes, and to output a coded signal which is characteristic to the selected photodiode 45. Therefore, it becomes possible to reduce the separation between the photodiodes that are arranged in a row to be less than the width of the light that is irradiated by the optical fiber. This leads to a higher density and more compressed arrangement of the photodiodes 45, and to a detection of the amount of rotation with higher accuracy.

It is apparent that the structure of the embodiment of the present invention described in the above will include various modifications without departing from the scope of the present invention.

Figure 4:
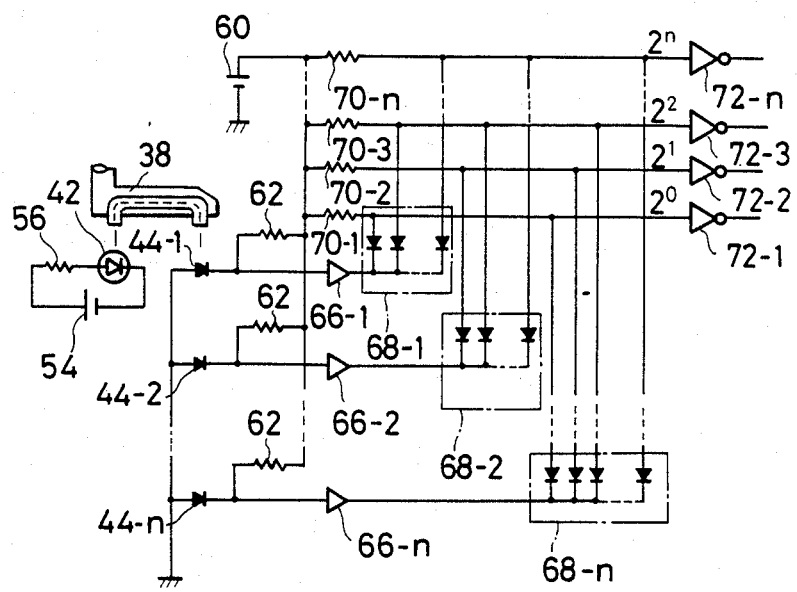
FIG. 4 is a circuit diagram for the signal processing circuit in the rotary encoder shown in FIG. 2.
Figure 5:
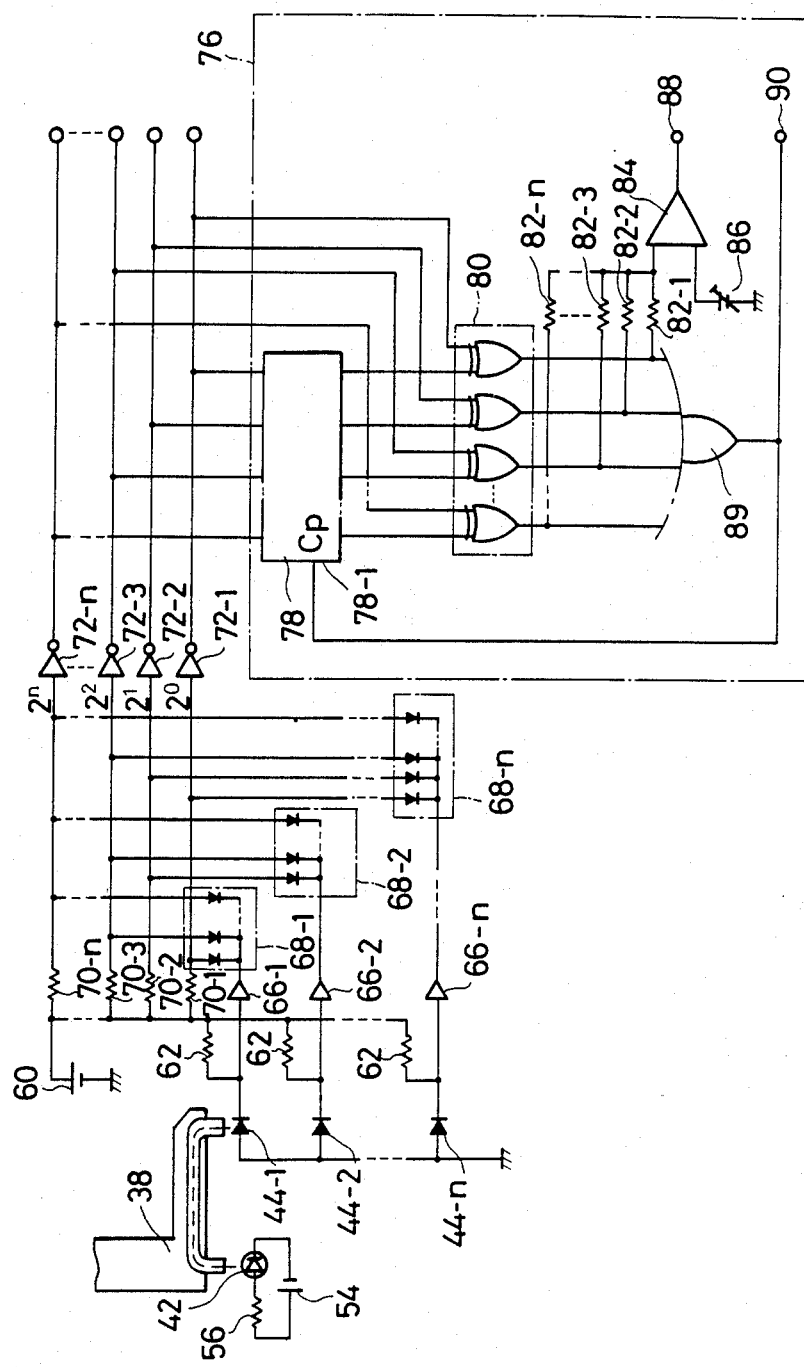
FIG. 5 is a circuit diagram for a modification in which a trouble shooting unit is added to the signal processing circuit shown in FIG. 4.
Figure 9:
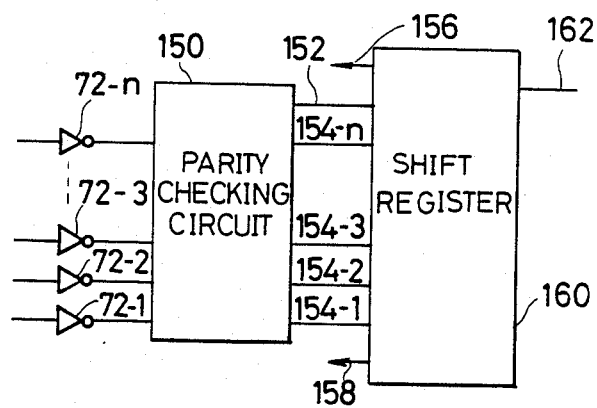
FIG. 9 is a circuit diagram for another modification to the signal processing circuit shown in FIG. 4.

Thus, for instance, the digital signals that are output from the NAND circuits 72-1, 72-2, 72-3, . . . , and 72-n in the embodiment shown in FIG. 4 are output as parallel signals that permit rapid processing. However, they may also be output as series signals by converting them. Namely, as shown in FIG. 9, each output signal from the NAND circuits 72-1, 72-2, 72-3, . . . , and 72-n may be checked as to its parity in the parity checking circuit 150. The parity check signal 152 and the angle detection signals 154-1, 154-2, 154-3, . . . , and 154-n, supplemented by a start signal 156 and a stop signal 158, may be output as a series signals 162 by means of a shift register or a multiplexer 160.

Moreover, the optical sensors may be constructed using elements made of a photo-electric body or elements with photo-voltaic property such as cds or pds, in addition to be constructed by using phototransistors or photodiodes as in the above embodiment. When the output current due to photo Darlington is sufficiently strong, amplification of the current by amplifier can be done without. Further, the digital signals output so as to show the rotation angle may be output as negative logic signals without being inverted to positive logic signals by means of the NAND circuits 72-1, 72-2, 72-3, . . . , and 72-n.

Figure 10:
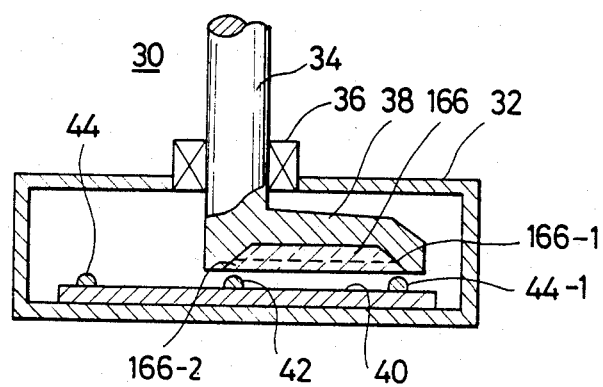
FIG. 10 is a cross-sectional view for a modification in which a prism is used in the light transfer route between the light-emitting element and the light-receiving element in the displacement detection unit of the rotary encoder shown in FIG. 3.

Next, referring to FIG. 10, a modification in which a prism is used in the optical transfer route between the light-emitting and light-receiving elements in the displacement detector in the rotary encoder shown in FIG. 3. Namely, light emitted by the light-emitting diode 42 is led to the photodiode 44 by the use of the prism 166 that is formed and held in the rotating member 38. In other words, light emitted from the light-emitting diode 42 is reflected by a first reflecting surface 166-1 of the prism that is formed inclined on one end of the rotating member 38 that faces the light-emitting diode 42 above of it. The reflected light is reflected again by a second reflecting surface 166-2 formed inclined on the other end of the member that faces the phototransistor 44 above of it, and then impinges upon a certain photodiode 44-1. In addition, mirrors may be used in place of the reflecting surfaces of the prism. Further, the reflecting surfaces or mirrors may be formed curved to give foci to these surfaces.

Figure 11:
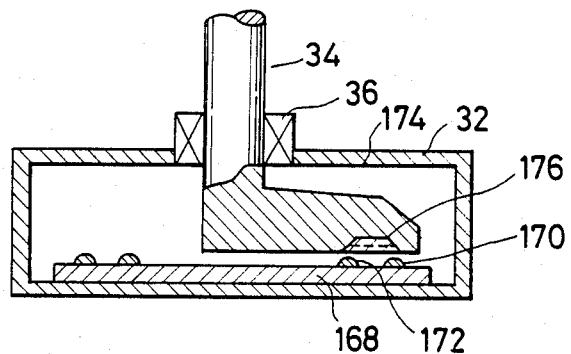
FIGS. 11 and 12 are cross-sectional views of the modifications to the displacement detection units shown in FIGS. 3 and 10, respectively.
Figure 12:
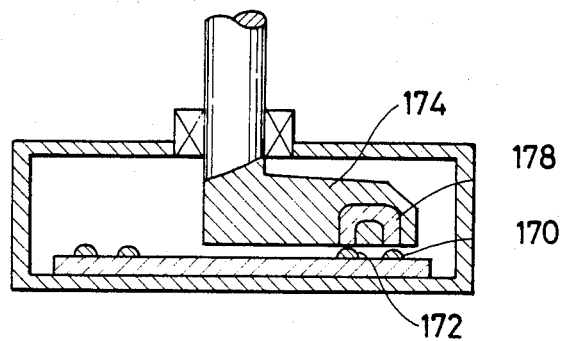

Moreover, the disposition of the light-emitting diodes and phtotransistors that are arranged on the semiconductor chip 40 needs not be limited to the ones shown in the embodiments shown in FIGS. 3 and 10, and may be such as shown in FIG. 11 or 12. Namely, on a semiconductor 168, with the intersection of the axis center of the rotation shaft 34 as the center, there are arranged a plurality of light-emitting diodes 170 on the outer circumference of one of the two concentric circles, and on the circumference of the inner concentric circle there are arranged photodiode 172 so as to correspond to each of the light-emitting diode 170 on the same radial direction. With this set-up, light emitted from a light-emitting diode 170 is transferred to a corresponding phototransistor 172 by means of a prism 176 or an optical fiber 178 formed in a rotating member 174. (The arrangement of the light-emitting diodes and the phototransistors may be reversed.) By such an arrangement of the light-emitting diodes 170 and the photodiode 172, a relatively spacious area can be secured at the center of the semiconductor chip, so that it facilitates the design and arrangement of such a circuit as for generating digital signals.

Figures 13, 14:
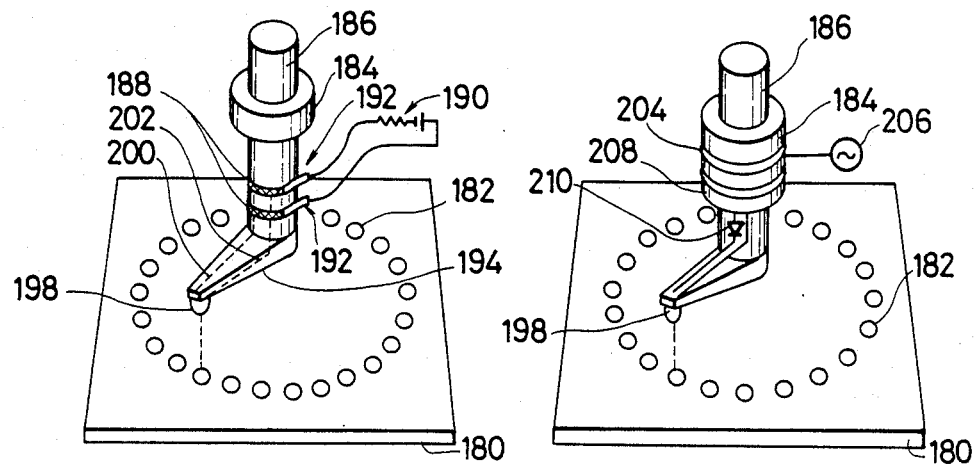
FIGS. 13 and 14 are perspective views of other modifications to displacement detection unit shown in FIG. 2.
Figure 17:
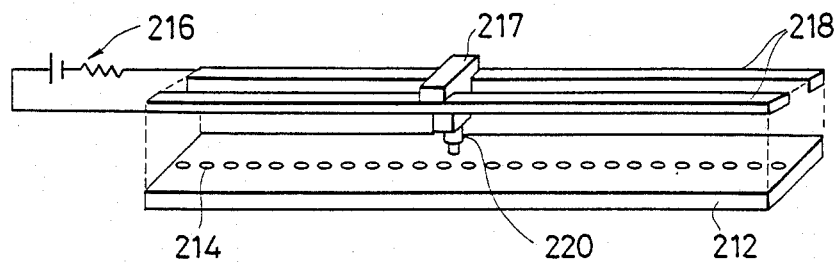
FIG. 17 is a perspective view which shows the construction of the case when the first embodiment in accordance with the present invention is applied to the linear encoder.

Still another arrangement is shown in FIG. 13. Namely, a plurality of photodiode 182 are arranged on a circumference with an equal separation, two strips of band-shaped electrode rings 188 are wound in parallel on the side surface of a rotation shaft 186 that is supported by a bearing 184, and two electrode plates 192 are connected to each of the electrode rings 188. The electrode rings 188 and the light-emitting diode 198, which is positioned at the tip of the rotating member 194 so as to move along the circumference on which are arranged phototransistors 182, are connected by lead wires 200 and 202 that are not shown in the figure. Electricity that is supplied to the electrode rings 188 from an external power source 198 via the lead wires 200 and 202, is sent to the light-emitting diode 198 to light up the diode 198. Interlocked with the rotation shaft 186, the light-emitting diode 198 encircles over the phototransistors 182 that are arranged on the circumference. Therefore, there is no need for providing a light-emitting diode and a power source for lighting on the semiconductor chip 180, making the circuit construction on the semiconductor chip simple. Moreover, there is a method of supplying current to the light-emitting diode 198 that moves around over the photodiode 182, as shown in FIG. 14. Namely, a high frequency wave from a high frequency power source 206 is supplied to a coil 204 that is fixed to the bearing 184, and an induced electromotive force is generate in a rotating coil 208 that is fixed to the rotation shaft 186. The exciting current that is generated in the rotating coil 208 that is fixed to the rotation shaft 186 is rectified by a rectifier 210 that is provided on the rotation shaft, and lights up the light-emitting diode 198. With such a construction it becomes possible to supply current to the rotating light-emitting diode by a simpler method and in a surer way than by the previous construction in which the light-emitting diode is lighted by means of the dectrode rings and the contact plates. Furthermore, the first embodiment in accordance with the present invention may also be applied to the linear encoder, as shown in FIG. 17. To cite an example, a plurality of photodiode 214 may be disposed in a row on a rectangular semiconductor chip 212 in its longitudinal direction with a predetermined separation, and two parallel linear guides 218, that serve also as the electrodes to which is supplied a current from a power source 216, are placed in the longitudinal direction above the semiconductor chip 212. Further, a linear traveler is provided, and is engaged slidably to the linear guides 218, that moves linearly facing each of the phototransistors 214, holding a light-emitting diode 220 that lights up by receiving current from the linear guides 218. When each of the photodiode 214 detects light from the light-emitting diode 220, it outputs a characteristic digital signal from a signal processing system that is not shown. In this way, it becomes possible to detect the position of the linear traveler 217 that holds the light-emitting diode 220, from the knowledge on the digital signal that is output.

Figure 15:
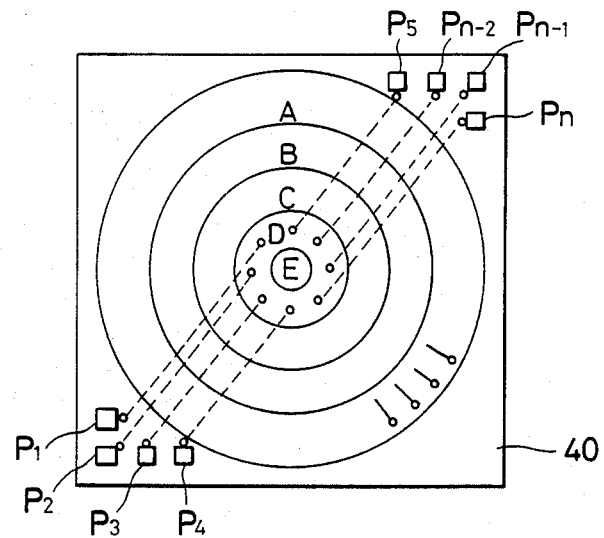
FIG. 15 is a dispositional diagram for illustrating the disposition of the circuit patterns that are formed on the semiconductor chip in the first embodiment shown in FIG. 2.
Figure 16:
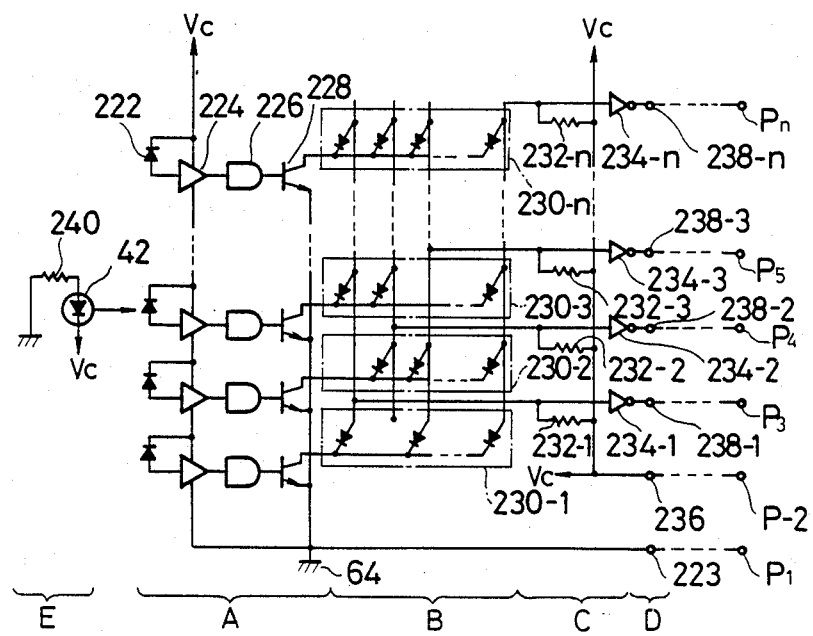
FIG. 16 is a circuit diagram for illustrating the circuit patterns of the signal processing circuit shown in FIG. 4 that is disposed in the dispositional diagram for the semiconductor chip shown in FIG. 15.

Next, by referring to FIGS. 15 and 16, description will be given about the disposition on the semiconductor chip 40 of the signal processing circuit of the first embodiment shown in FIG. 3 for outputting a digital signal which is characteristic to each of the photodiode 44 that received light. Further, as shown in FIG. 15, the surface of the semiconductor chip 40 is subdivided into four annular regions A, B, C, and D that are partitioned by five concentric circles and one region E that consists of a circle at the center. At the four corners (in the figure, two of the four corners) on the surface of the semiconductor chip 40, there are formed as bonding pads, a terminal $P_1$, for the ground, a terminal $P_2$ for a power source Vc, and digital signal output terminals $P_3$, $P_4$, $P_5$, ..., and $P_n$. As shown in FIG. 16, in each of the regions A, B, C, D, and E there are arranged a circuit which is equivalent to the circuit for outputting digital signals for the embodiment shown in FIG. 4. Namely, in the outermost annular region A there are arranged along the circumference with equal spacing a plurality of sets, each set consisting of a photodiode 222, a linear amplifier 224 for amplifying the current that is detected by the diode, a Schmitt circuit 226 for binary coding the amplified detected current, and an open-collector transistor 228 that is operated by the binary coded signal that is obtained. In the region B which is next to the region A on the inside, there are arranged diode groups 230-1, 230-2, 230-3, and 230-n, each group being surrounded by the single-chained line in the figure, that are connected respectively to the transistors 228 in the region A. In the region C on the inside of the region B, there are arranged load resistors 232-1, 232-2, 232-3, .., and 232-n that serve as the pull-up resistors and NAND circuits 234-1, 234-2, 234-3, ..., and 234-n. In the region D on the inside of the region C, there are arranged a terminal 223 for the ground, a terminal 236 for the power source Vc, and output terminals 238-1, 238-2, 238-3, ..., and 238-n of the NAND circuits 234-1, 234-2, 234-3, and 234-n. In the region E is arranged a light-emitting diode 42 that is lighted up by the supply of current from the ground terminal 223 and a power source terminal 236, together with a resistor 240. The connection between each of the terminals in the region D and each of the terminals at the corners on the semiconductor chip 40 may be done by such a method as given below. Namely, a method of connecting the terminals that are taken out to the reverse side of the semiconductor chip 40 by drilling holes on the semiconductor chip 40, or a method in which the semiconductor chip 40 is given a two-layer structure and the connection of the terminals is achieved between the layers by taking out the terminals to the interlayer region. In addition, in place of the photodiode 222, the linear amplifier 224, and the Schmitt circuit 226, a photo Darlington may be constructed by the phototransistor and the transistor.

As in the above, the photodiode 222 are arranged on a circumference on the semiconductor chip 40 and the diode groups 230-1, 230-2, 230-3, ..., and 230-n are connected to the load resistors 232-1, 232-2, 232-3, ..., and 232-n so as to output characteristic digital signals, so that the rotation angle of the rotation shaft 34 can be detected in absolute value from the digital signal. Moreover, the light-emitting diodes, the light-receiving diodes, and further, the circuits for generating digital signals that are characteristic to the respective phototransistors are provided in a united body as an integrated circuit on the same semiconductor chip. An extremely high accuracy disposition of the light-emitting and the light-receiving diodes can be attained with high density as a characteristic feature of the integrated circuit, so that it becomes possible to improve the detection precision sharply, and to realize a rotary encoder which is super miniaturized and super light in weight.

Next, referring to FIGS. 18 to 26, a second embodiment of the displacement detector in accordance with the present invention will be described.

Figure 18:
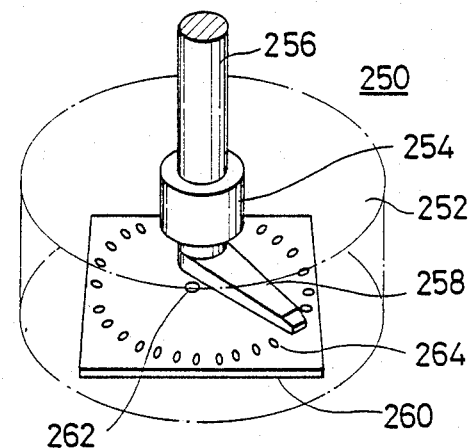
FIG. 18 is a perspective view of a second embodiment of the present invention in accordance with the present invention.
Figure 19:
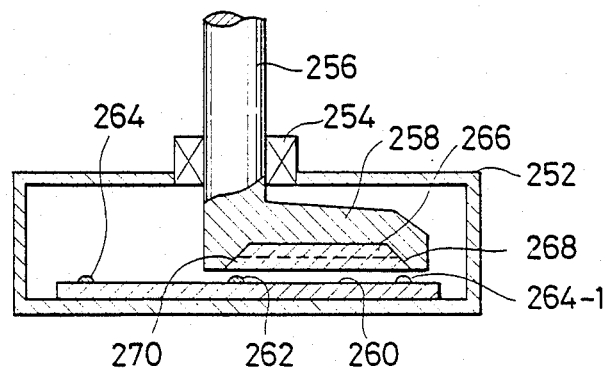
FIG. 19 is a cross-sectional view of the rotary encoder shown in FIG. 18.
Figure 20:
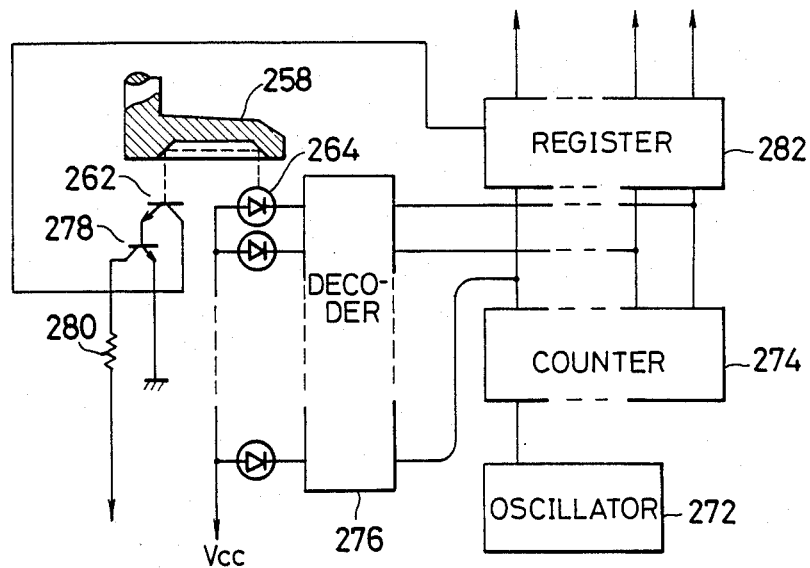
FIG. 20 is a circuit diagram of the signal processing circuit in the rotary encoder shown in FIG. 18.

As shown in FIGS. 18 and 19, a second embodiment of the rotary encoder in accordance with the present invention is shown with reference numeral 250. The rotary encoder 250 has a case 252 that consists of a cylindrical shall shown by the single-chained line in FIG. 18, and has a rotation shaft 256 that is inserted to the interior of the case 252 perpendicular to the center of the top surface of the case 252, being supported by a bearing 254. The rotation shaft 256 rotates coaxially with the rotation shaft, that is not shown, of the object to be measured, and at the tip of the rotation shaft 256 in the case 252 there is fixed a rotating member 258 with its one end supported by the rotation shaft 256 and its the other end arranged to rotate around the axis center of the rotation shaft 256 together with the rotation shaft 256. On the inside bottom surface of the case 252 there is placed a square semiconductor chip 260. At the section on the semiconductor chip 260 where the axis center of the rotation shaft 256 intersects the chip there is arranged a phototransistor 262 that serves as the light-receiving element. Further, on the semiconductor chip 260 there are arranged a plurality of light-emitting diodes that serve as light-emitting elements on the circumference of a circle that has the phototransistor 262 as the center, in such a manner as to be positioned below the other end of the rotating member 258. Namely, on the surface of the rotating member 258 that faces the semiconductor chip 260 there is provided a prism 266 as shown in FIG. 19. Light emitting by one of the plurality of the light-emitting diodes 264 is reflected by a first reflecting surface 268 of a prism 266 that is arranged inclined on one end of the rotating member 258 facing the light-emitting diodes 264. The reflected light is reflected again by a second reflecting surface 270 that is arranged inclined on the other end of the rotating member that faces the phototransistor 262, and impinges upon the phototransistor 262. Here, the light-emitting diodes are flashed in turn by means of a signal processing circuit that will be described below that is formed on the semiconductor chip 260, so as to have a rotation of the lighted position of the light-emitting diodes 264 that are arranged on the circumference of a circle. Thus, when the illuminating light from one of the light-emitting diode 264-1 impinges upon the phototransistor 262 via the rotating member 258, the signal processing circuit outputs a digital signal which is characteristic to the light-emitting diode 264-1 that emitted the illuminating light. In the following, the process of outputting a digital signal which is assigned individually to each of the light-emitting diodes 264 by means of the signal processing circuit will be described by making reference to FIG. 20.

On the semiconductor chip 260, a current is supplied to the light-emitting diodes 264 so as to keep the lighted position of the light-emitting diodes 264 flash successively in one direction, by means of a flashing circuit that is provided in the above circuit. Namely, the clock number from an oscillator 272 is counted by a counter 274 with scale of n which is equal to the number of light-emitting diodes 264, and a digital output signal that corresponds to the counted value is output to a decoder 276. In the decoder 276, the light-emitting diode 264 that corresponds to the counted value of the counter 274 is flashed in turn. Light from an arbitrary light-emitting diode 264 that is flashed in this manner, is detected by the phototransistor 262 that receives light via the reflecting surfaces 268 and 270 of the prism 266 that is arranged in the rotating member 258. Then, a collector current will flow in the phototransistor 262 that detected the light, the current is amplified by the photo-Darlington 278, and a resistor 280 that is connected to the DC power source Vcc in series is short-circuited. The negative pulse which is a negative logic output that is obtained as a result of short-circuiting of the resistor 280 is input to a register 282. When a negative pulse is input, the register 282 holds the counted value of the counter 274 and outputs a digital output signal that corresponds to the counted value. Since the values counted by the counter correspond to the respective light-emitting diodes 264, so that the signal output by the register 282 represents an angle signal that shows the rotation angle of the rotation shaft 256 in absolute value.

In this manner, as a result of rotation that accompanies the rotating member 258 of the rotation shaft 256 that is interlocked to the rotation of the object to be measured, light from a certain light-emitting diode 264 is detected by a phototransistor 262 via the reflecting surfaces 268 and 270 of the prism 266 provided in the rotating member 258. Then, there is obtained a digital signal which is characteristic to the light-emitting diode 264 that emitted light that is detected, so that it becomes possible to detect the rotation angle of the rotation shaft 256 as an absolute angle. Furthermore, the light-emitting diodes, the phototransistors, and moreover, the circuits for generating digital signals that are characteristic to the respective light-emitting diodes are provided in a united body on the same semiconductor chip as an integrated circuit. Therefore, as a special feature of the integrated circuit it becomes possible to mount all the elements with high density, and hence, to realize a rotary encoder which is super miniaturized and super light in weight that sharply improves the detection precision.

Moreover, it is apparent that analogous to the first embodiment of the present invention various modifications may be added to the construction of the second embodiment without departing from the scope of the present invention.

Figure 21:
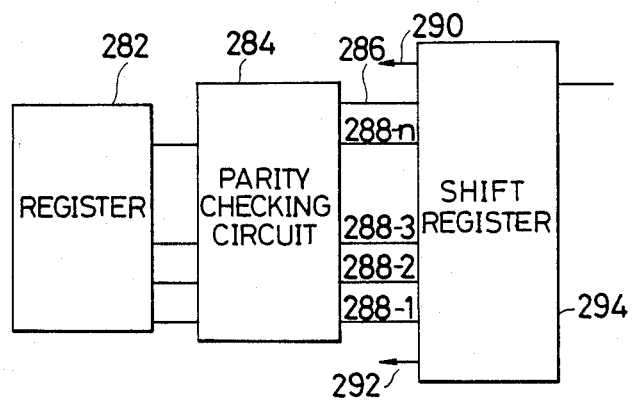
FIG. 21 is a circuit diagram for a modification to the signal processing circuit shown in FIG. 20.

Thus, for instance, the digital signals that represent the detected signals output from the register 282 as parallel signals in the second embodiment may also be output as series signals by conversion. Namely, as shown in FIG. 21, each of the outputs from the register 282 may be checked as to the parity in a parity checking circuit 284, and may be output as series signals from a shift register or a multiplexer 294, by supplementing the parity checking signal 286 and the angle detection signals 288-1, 288-2, 288-3, . . . , and 288-n by a start signal 290 and a stop signal 292.

Moreover, the photo sensors may also be constructed using photodiodes or elements made of photoelectric material or with photo-voltaic property such as cds or pds, in addition to the phototransistors.

Figure 22:
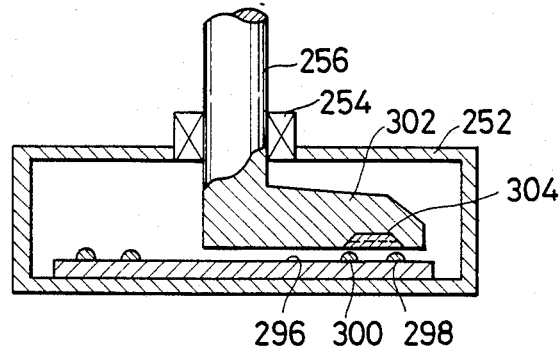
FIG. 22 is a cross-sectional view for illustrating a modification to the displacement detection unit in the second embodiment shown in FIG. 19.
Figure 23:
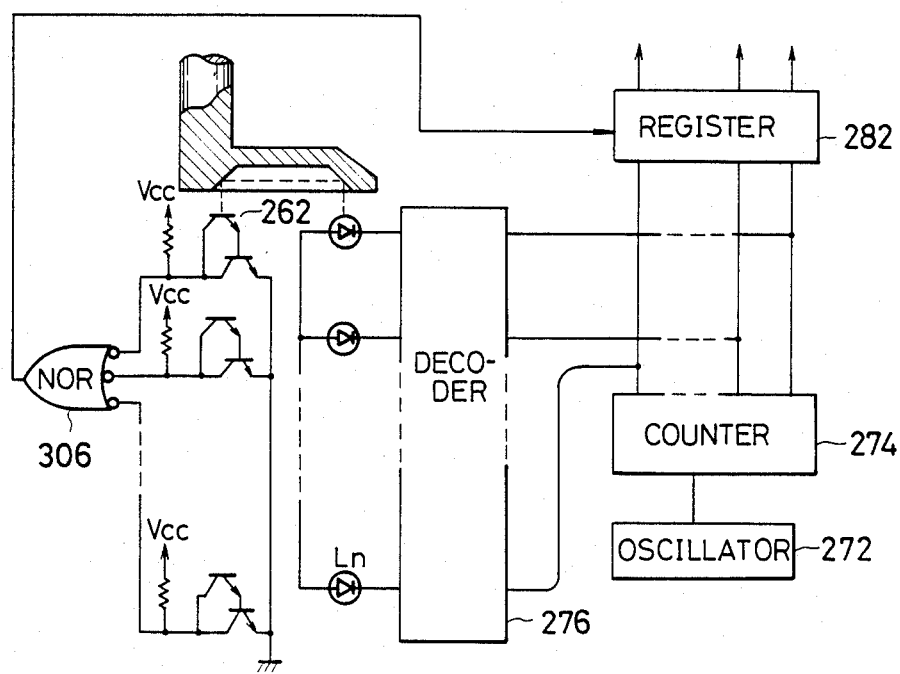
FIG. 23 is a circuit diagram for the signal processing circuit in the modification shown in FIG. 22.

In addition, the disposition of the light-emitting diodes and the phototransistors on the semiconductor chip need not be limited to that of the embodiment described in the foregoing. Thus, for example, it may be as shown in FIG. 22. Namely, on a semiconductor chip 296 there are two concentric circles with the intersection of the rotation shaft 256 with the chip 296 as the center. On the outer concentric circle there are arranged a plurality of phototransistors 298. On the inner concentric circle there are arranged light-emitting diodes 300 on the radial directions corresponding to each of the phototransistors 298. Between a pair of phototransistor 298 and light-emitting diode 300, light emitted by the light-emitting diode 300 that is flashed is transmitted to the phototransistor 298 by means of a prism 304 that is formed in the rotating member 302. In this modification, as shown also in FIG. 23, a negative pulse which is generated by the detection of the incident light by the phototransistor 262, is input to a NOR circuit 306, and the positive pulse output from the NOR circuit 306 is sent out to the register 282. The register 282 that receives a positive pulse, outputs to the outside the counted value of the counter.

With such a disposition of the phototransistors 298 and the light-emitting diodes 300, relatively spacious region can be secured at the center of the semiconductor chip so that it becomes possible to facilitate the design and arrangement of circuits such as the one for generating digital angle signals.

Figure 24:
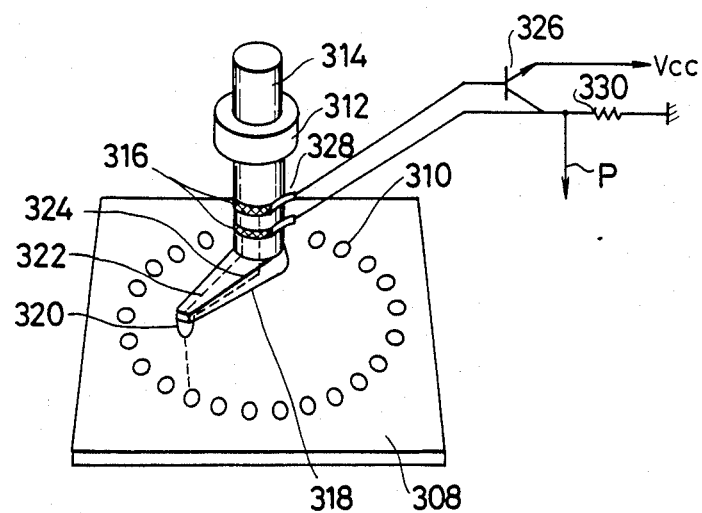
FIG. 24 is a cross-sectional view for showing the modification to the displacement detection unit in the second embodiment shown in FIG. 19.

Still another modification is shown in FIG. 24. Namely, on a semiconductor chip 308, a plurality of light-emitting diodes 310 are arranged on a circumference with equal separations. On the side surface of a rotation shaft 314 that is supported by a bearing 312, there are wound in parallel two band-like electrode rings 316. These electrode rings 316 serve as electrodes for a phototransistor 320 that is arranged at the tip of the rotating member 318, facing to each of the light-emitting elements, and are connected by lead wires 322 and 324 that are shown by dotted lines in the figure. The phototransistor 320 constitutes a photo Darlington via a transistor 326 and the electrode rings 316, and the transistor 26 is connected to the phototransistor 320 via the plates 328 that make contact with the electrode rings 316. When the phototransistor 320 detects light, a collector current flows to the transistor 326 which short-circuits a resistor 330 to the ground so that there is obtained a negative pulse P. Then, the negative pulse P is sent to the register 282. With such a construction, the phototransistor 320 that is interlocked with the rotation shaft 314 moves round over the light-emitting diodes 310 that are arranged on a circumference. Therefore, there is no need for arranging phototransistors on the semiconductor chip 308, making the circuit construction on the semiconductor chip 308 simple.

Figure 25:
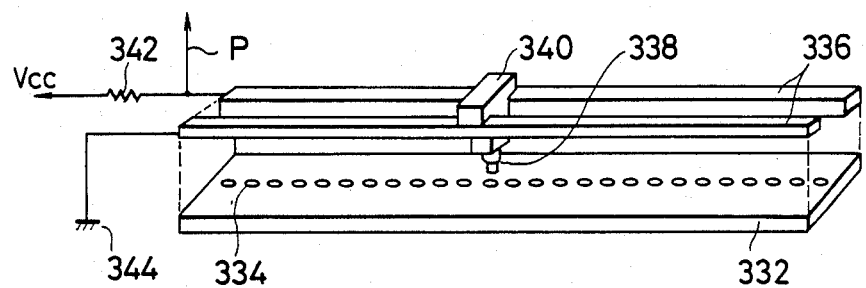
FIG. 25 is a perspective view for illustrating the construction of the case in which the second embodiment in accordance with the present invention is applied to the linear encoder.

Moreover, the present invention may also be applied to the linear encoder. As an example, as shown in FIG. 25, a plurality of light-emitting diodes 334 are disposed in a row with a predetermined separation along the longitudinal direction of a rectangular semiconductor chip, and two linear guides consisting of rectangular pillars made of a conducting material are laid over the semiconductor chip 332 in the longitudinal direction. Then, a linear traveler 340, that holds a phototransistor 338 consisting of a photo Darlington that uses the linear guides 336 so as to let it move linearly in a state of facing each of the light-emitting diodes 334, is engaged slidably to the linear guides 336. Now, the light-emitting diodes 334 are lighted up in turn so that when the phototransistor 338 detects light from a light-emitting diode at an arbitrary position, a resistor 342 that is connected to the power source Vcc is short-circuited to the ground, and a negative pulse P is sent out to the register 282. As a result, the register 282 outputs a digital signal which is characteristic to the light-emitting diode 334 that detected the light. In this way, it becomes possible to detect the position of the linear traveler that holds the phototransistor 338.

Figure 26:
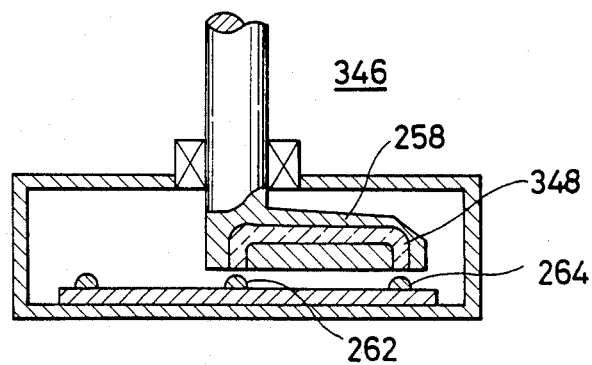
FIG. 26 is a cross-sectional view of the modification which employs an optical fiber to the light transfer route in the displacement detection unit shown in FIG. 19.

Now, in the second embodiment shown in FIG. 18, transfer of light from a light-emitting diode 264 to the phototransistor 262 is carried out by means of the prism that is fixed to the rotating member 258. However, analogous to the first embodiment, light emitted from a light-emitting element may also be led directly to the light-receiving element by using optical fibers and 348 that are held by the rotating member 258, as shown in FIG. 26. By the use of the optical fibers 348, it becomes possible to realize a securer transfer of light from a light-emitting diode 264 to the phototransistor 262. In addition, light transfer may be achieved by providing mirrors on the prism. Further, by forming the reflecting surface or the mirror so as to have a focus, its operation can be made more precise.

Next, referring to FIGS. 27 to 31, a third embodiment of the displacement detector in accordance with the present invention will be described.

Figure 27:
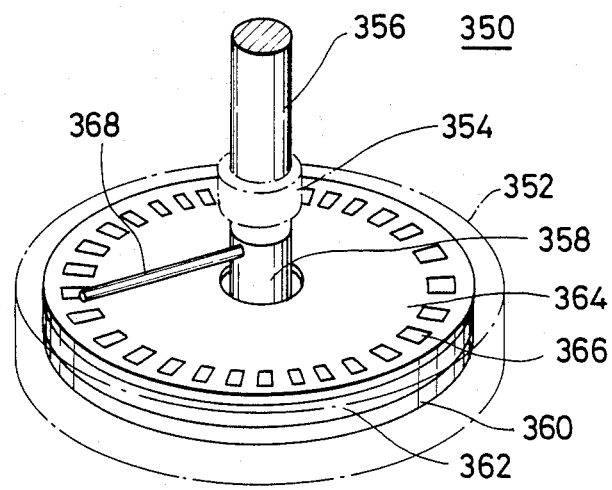
FIG. 27 is a perspective view of a third embodiment in which the present invention is applied to the rotary encoder.
Figure 28:
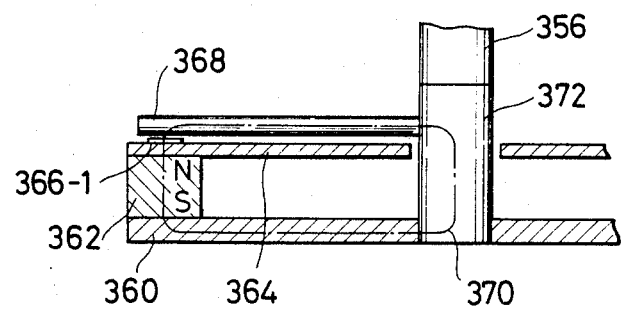
FIG. 28 is a cross-sectional view of the rotary encoder shown in FIG. 26.

As shown in FIGS. 27 and 28, a rotary encoder by the third embodiment of the present invention is shown with reference numeral 350. The rotary encoder 350 has a cylindrical case 352 that is shown by the single-chained line in FIG. 27. A bearing 354 that is provided at the center of the top surface of the case 352 holds a rotation shaft 356 that is interlocked with the rotation of the object to be measured so as to have the axis center of the shaft to be perpendicular to the top surface. On one end that is inside of the case 352 of the rotation shaft 356 that is held by the bearing 354, there is linked coaxially a circular rod 358 made of magnetic material that has approximately equal diameter as the rotation shaft 356. The tip of the circular rod 358 is arranged to be slidably rotatable by being inserted to an aperture, that has approximately equal diameter as that of the rotation shaft 356, formed at the central part of a disk 310 made of magnetic material and is placed on the inside of the bottom surface of the case 352.

On the side toward the top surface of the case 352 of the disk 360 made of magnetic material, there is placed an annular magnet 362, with outer diameter approximately equal to the diameter of the disk 360, magnetized to have opposite poles on the disk 360 side and on the rotation shaft 354 side. Further, facing the disk 360 across the annular magnet 362, there is placed a semiconductor chip 364 that has a diameter approximately equal to that of the disk 360, making a close contact with the annular magnet 362, in a state in which the rotation shaft 356 penetrating an aperture that is formed at the central part of the chip 364. In the area on the opposite side of the peripheral part of the semiconductor chip 364 where it makes a direct contact with the annular magnet 362, there are arranged numerous magnetic sensors 366, that consist of magnetic resistance element like indium antimonide whose state such as the characteristic resistance varies in response to the magnetic change, on a circumference along the annular magnet 362 with a predetermined separation. Further, a needle 368 made of a magnetic substance is fixed to the circular rod 358 made of magnetic substance, on the rotation shaft 356, with the tip part of the needle 368 facing the magnetic sensors by a predetermined distance separated from them. That is, the tip part of the needle 368 moves around inside the case 352, over and facing, each of the magnetic sensors 366, following the rotation of the rotation shaft 356. As shown in FIG. 28, when, for example, the tip of the needle 368 is situated at a position above a certain magnetic sensor 366-1 that faces the needle, as a result of rotation of the rotation shaft 356, magnetic flux that passes through the magnetic sensor 366-1 which is over the annular magnet 362 becomes larger in comparison to the fluxes through other magnetic sensors 366. In other words, the magnetic flux that leaves the annular magnet 362 along the path shown by the single chained line, passes through the magnetic sensor 366-1 via the needle 368, and returns to the annular magnet 362 by passing through the tip 372 of the rotation shaft 356 and the disk 360.

The magnetic flux density of the magnetic field that includes the magnetic sensor 366-1 is increased due to the needle 368 that faces the sensor. Accordingly, the change in the resistance of the magnetic sensor 366-1 is detected by the signal processing circuit 376 (see FIG. 29) that is arranged on the semiconductor chip 364, and is converted to a signal that is characteristic to each of the magnetic sensors.

Figure 29:
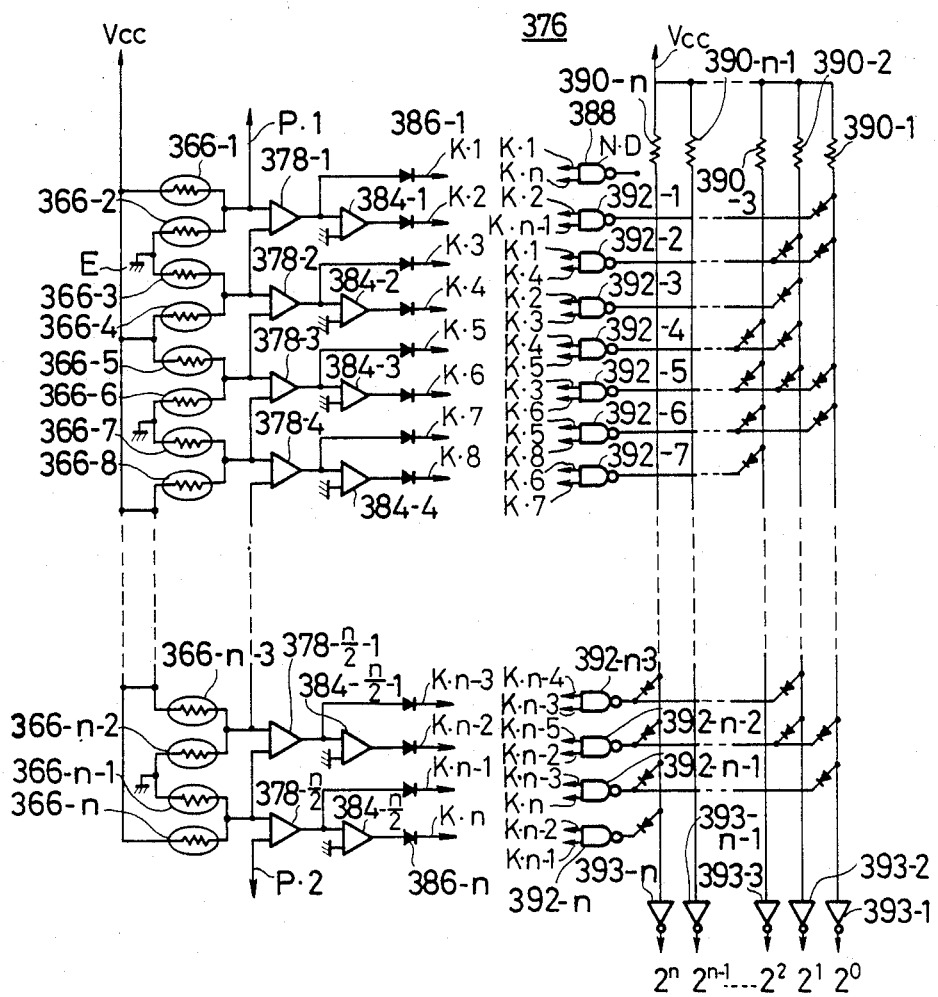
FIG. 29 is a circuit diagram for the signal processing circuit in the rotary encoder shown in FIG. 26.

Now, referring to FIG. 29, the signal processing circuit 376 that outputs a coded signal that is characteristic to each of the magnetic sensors 366 whose resistance is varied influenced by the change in the magnetic flux.

The predetermined number of magnetic sensors 366 that are arranged with equal separation on the circumference of a circle on the semiconductor chip 364, form bridge circuits in sets of four sensors. (Here, n is a multiple of 4). In FIG. 29, of the magnetic sensors 366-1, 366-2, 366-3, ..., 366 (n−2), 366-(n−1), and 366-n, four magnetic sensors 366-5, 366-6, 366-7, and 366-8, for instance form a bridge circuit. Of a pair of terminals for each of these bridge circuits, the junctures on one side of magnetic sensors 366 are connected to the power source Vcc, while the other junctures are short-circuited to the ground E. The two sets of magnetic sensors 366 that are formed by series-connecting two magnetic sensors 366 that are parallel-connected between the power source Vcc and the ground E that form a bridge circuit, have the connection points of series-connection of each of the magnetic sensors connected to the first input terminals of the differential amplifiers 378-1, 378-2, 378-3, ..., 378-(n/2−1), and 378-n/2. Furthermore, these connection points are connected to the second input terminals that are different from the first input terminals to which thy are connected. The output of each of the first stage of differential amplifiers 378-1, ..., 378-(n/2−1), and 378-(n/2) is divided into two branches. One of the branches is input to a NAND circuit 392-1, 392-2, ..., 392-n via a diode 386-1, 386-2, ..., 386-n. The other branch is input to an input terminal of each of a second set of differential amplifiers 384-1, 384-2, ..., 384-(n/2−1), and 384-(n/2) whose the other terminals are grounded, and is output with its polarity inverted.

The output signals of the next stage of inverting amplifiers 384-1, ..., 384-(n/2−1), and 384-(n/2) are input to the NAND circuits 392-1, 392-2, ..., 392-n via diodes 386-1, 386-2, ..., 386-n.

Here, the NAND circuits 392-1, 392-2, ..., 392-n are provided in number equal to that of the magnetic sensors. Their input terminals receive the output signals of the first stage of differential amplifiers 378-1, 378-2, ..., 378-(n/2−1), and 378-(n/2) and the output signals of the next stage of differential amplifiers 384-1, 384-2, ..., 384-(n/2−1), and 384-(n/2). However, the manner in which the output signals of the first stage of differential amplifiers 378-1, 378-2, ..., 378-(n/2−1), and 378-(n/2) and the output signals of the next stage of inverting amplifiers 384-1, 384-2, 384-(n/2−1), and 384-(n/2) are input to the NAND circuits 392-1, 392-2, ..., 392-n is different for each of the NAND circuit 388. Namely, as shown in FIG. 29, these output signals are input to the NAND circuits 392-1, 392-2, ..., 392-n in the manner in which the arrows K.1, K.2, ..., K.(n−1), and K.n on the output side of each of the diodes 386-1, 386-2, ..., 386-n 35 are connected to the arrows K.1, K.2, ..., K.(n−1), and K.n on the input terminal side of the NAND circuits 388, arrows with the same numbers in the figure being connected, respectively. The output terminals of the NAND circuits 392-1, 392-2, ..., 392-n are connected to the resistors 390-1, 390-2, 390-3, ..., 390-(n−1), and 390-n each of whose one end is connected to the power source Vcc in a manner that is specified for each NAND circuit 392. Namely, each of the NAND circuit 388 and each of the resistors 390-1, 390-2, 390-3, ..., 390-(n−1), and 390-n are connected by a combination that is different for each combination. Moreover, a lead wire for a coded signal is connected at the juncture of each of the NAND circuits 392-1, 392-2, ..., 392-n and each of the resistors 390-1, 390-2, 390-3, ..., 390-(n−1), and 390-n, and a coded signal is output via each of the NOT circuits 393-1, 393-2, ..., 393-(n−1), 393-n. As shown in FIG. 29, in the present invention each of the NAND circuits 392 and each of the resistors 390 are connected via a diode in such a way as to output a coded signal from each of the NOT circuits 393-1, 393-2, ..., 393-n−1, 393-n as a coded signal that represents a reflected binary signal assigned in turn to each of the magnetic sensors 366.

Furthermore, each of the NOT circuits 393-1, 393-2, ..., 393-(n−1), 393-ncorresponds successively to each of the digits for $2^0, 2^1, 2^2, \ldots, 2^{n-1}$, and $2^n$ of the reflected binary signals. In addition, in FIG. 29 the lines represented by the arrows P.1 and P.2 are connected each other. Further, the magnetic circuits 366 and the above conversion circuit are arranged on the semiconductor chip 364 according to the conventional manufacturing process for integrated circuits and the like.

The process of outputting a coded signal as a set of reflected binary signals that are characteristic to each of the magnetic sensors 366-1, 366-2, 366-3, ..., 366-(n−1), and 366-n will now be described by using concrete examples.

Figures 30, 31:
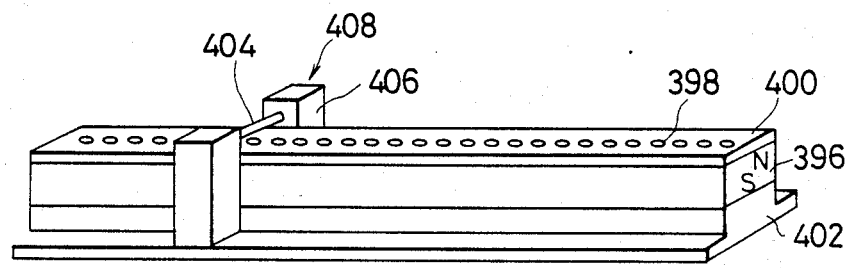
FIG. 30 is an explanatory diagram for illustrating the polarity of the output from the differential amplifier in the circuit shown in FIG. 29.
FIG. 31 is a perspective view for illustrating the construction of the case in which the third embodiment in accordance with the present invention is applied to the linear encoder.

In FIG. 30 are shown the polarities of the outputs of the first stage of differential amplifiers 378-1, 378-2, 378-3, 378-(n/2−1), and 378-(n/2), for the case when the tip of the needle 368 moves around in the case 352 by successively facing the magnetic sensors 366-1, 366-2, 366-3, ..., 366-(n−1), and 366-n as a result of following the rotation of the rotation shaft 356. In the figure, an upward and downward pointed arrows indicate a positive and negative outputs, respectively.

As a first example, let us consider the case when the tip of the needle 368 faces the magnetic sensor 366-3 as a result of the rotation of the rotation shaft 356. Corresponding to this, a positive signal is output from the differential amplifier 378-1 while a negative signal is output from the differential amplifier 378-2. The positive output from the differential amplifier 378-1 of the first set is input via a diode 386 to the NAND circuit 388 that has the input terminal marked as K.1 at the center of FIG. 29.

On the other hand, the negative output from the differential amplifier 378-2 is output inverted from the inverting amplifier 384-2 of the next stage, and is input via a diode 386 as a positive output signal to the input terminal of the NAND circuit 388 that carries the arrow K·[4] in the figure. Then, the output signal of the NAND circuit 388 that has the input terminals indicated by the arrows K·[1] and K·[4] in the figure becomes "0". Of the resistors 390-1, 390-2, 390-3, . . . , 390-(n−1), and 390-n, the resistors 390-1 and 390-2 that are connected via diodes 386 to the NAND circuit that has an output signal "0" are short-circuited to the ground that is built in the NAND circuit 388 but is not shown in the figure. In this case, a negative logic signal "0" is input to each of the respective NOT circuits so that these NOT circuits output a positive logic signal "1" by inverting the input. Further, the resistors other than 390-1 and 390-2, namely, the resistors 390-3, . . . , 390-(n−1), and 390-n are not short-circuited to the ground so that there are input a negative logic signal "1" to these NOT circuits that correspond to these resistors, and thus there are output from these circuits an inverted positive logic signal "0".

Therefore, a positive logic signal "110 . . . 00" is output from the NOT circuits, and this set of signals serves as a coded signal that represents the reflected binary signal that is characteristic to the magnetic sensor 366-3.

As a second example, the case in which the tip of the needle 368 faces the magnetic sensor 366-n will be described next.

In this case, there is output a negative signal from the differential amplifier 378-(n/2−1), while there is output a positive signal from the differential amplifier 378-(n/2).

The output of the differential amplifier 378-(n/2−1) is inverted to a positive output signal by the inverting amplifier 384-(n/2−1) of the next stage, and is input via a diode 386 to the NAND circuits that have input terminals indicated by the arrows K·(n−[2]) at the center of FIG. 29. Then, of the NAND circuits to which are input via diodes 386 the positive output from the differential amplifier 378-(n/2), and have input terminals designated by arrows K·(n−1) in FIG. 29, the NAND circuit that carries an input terminal designated by the arrow K·(n−2) in FIG. 29 outputs a signal "0". As a result, the resistor 390-n is short-circuited to the ground, while the other resistors 390-1, 390-2, 390-3, . . . , and 390-(n−1) are not short circuited, so that a set of positive logic signals "000 . . . 01" is output from the NOT circuits. This set of positive logic signals "000 . . . 01" is the coded signal that serves as the displacement detection signal that is characteristic to the magnetic sensor 366-n.

In this manner, it becomes possible to specify the magnetic sensor in which a change in the resistance value has taken place, by means of a set of reflected binary signals that is a coded signal output from the NOT circuits. Consequently, the position of the needle 368 that caused a change in the resistance value of the magnetic sensor, in other words, the position of the needle 368 that moves around facing successively each of the magnetic sensors, as a result of its being linked to the rotation of the object to be measured, can also be specified. Therefore, the rotation angle of an object to be measured can be detected in absolute value with high precision from the coded signal that is output, by the use of a rotary encoder in accordance with the present embodiment. In addition, the rotary encoder of the present embodiment involves no reading errors between the light-emitting and the light-receiving elements such as those exist in the case of a rotary encoder of photoelectric type. Moreover, the rotary encoder of the present embodiment has high reliability and excellent environment-proof, shock-proof, and noise-proof characteristics such as a sharp decrease in the volume of the device for equal resolution when compared to a device of the photoelectric type, and no need for covering the entire device with a container of high degree of air-tightness in order to securely shut off the external disturbing light that will become the cause of malfunctions.

The linear encoder which is a modification to the present invention consists of a bar magnet 396 which is magnetized in the direction perpendicular to a plane in the longitudinal direction of a slender square pillar, a semiconductor chip 400, in the neighborhood of whose bottom surface the magnetic field is approximately perpendicular, which makes a close contact with the above-mentioned plane, and has numerous magnetic sensors 398 placed with equal separation in the longitudinal direction of the magnet. It further includes a board 402 made of magnetic material that is joined just sufficiently to the surface that faces the above-mentioned plane of the bar magnet that makes close contact with the semiconductor chip 400, having steps on both sides of the longitudinal direction. It includes moreover a slider 408, movable in the longitudinal direction linked to the motion of the object to be measured, consisting of a magnetic supporting body 406 that supports a magnetic needle 404 at its both ends, faces successively the magnetic sensors 398 by making contact with both sides of the board 402 in its longitudinal direction, and a signal processing circuit that outputs a coded signal that is characteristic to each of the magnetic sensors 398, by detecting a change in the resistance of each of the magnetic sensors 398 that are arranged o the semiconductor chip 400. In such a construction, when the needle 404 faces a certain magnetic sensor 398 by means of a slider 408, the magnetic flux that passes through the magnetic sensor 398 increases compared with that of other magnetic sensors 398. The detected signal from the magnetic sensor 398 that detected a change in the magnetic flux is output, after converted by the signal processing circuit that is integrated on the semiconductor chip, to a coded signal that is characteristic to each of the magnetic sensors 398. Accordingly, it is possible to specify the position of the magnetic sensor 398 in which there occurred a change in the passing magnetic flux, and the position of the slider that is equipped with the needle 404, from the coded signal that is output. Namely, the displacement of the object to be detected that is linked to the slider can be determined from the coded signal that is obtained. The construction of the signal processing circuit to be used in the present modification may be the signal processing circuit shown in FIG. 29 that was used in the preceding embodiment.

Further, the third embodiment is not limited to what has been described in the foregoing, and various modifications can be made within the range of the technical ideas contained in the present invention.

For instance, the coded signals characteristic to each of the magnetic sensors are output from the NOT circuits as reflected binary signals (Gray code) in the foregoing description. However, these signals may be output as binary codes, logarithmic code, or others by changing the connection via diodes between each of the NAND circuits and each of the resistors.

Moreover the signals may also be output directly as negative logic signals without going through the NOT circuits. Further, the magnetic sensors may be formed by using the Hall elements.

Still further, the permanent magnet that is used as the source for generating the magnetic flux in the embodiment described in the foregoing is arranged at the position that makes a contact with the semiconductor chip on which are formed the magnetic sensors. However, it needs not be limited to that example. Thus, for example, a method may be adapted in which the needle itself is also magnetized. In particular, in the first embodiment, the needle may be supported by magnetizing also the tip section of the rotation shaft, and in the second embodiment, the needle may be supported by magnetizing the supporting body also. Namely, inasmuch as it is a means for varying the magnetic flux, of the magnetic field that contains the magnetic sensors, along the line of each magnetic sensors, no unnecessary restriction need be imposed on the composition of the important part, such as the needle or the supporting member that supports the needle, provided that the original function is retained.

Next, referring to FIGS. 32 to 36, a fourth embodiment of the displacement detector in accordance with the present invention will be described.

Figure 32:
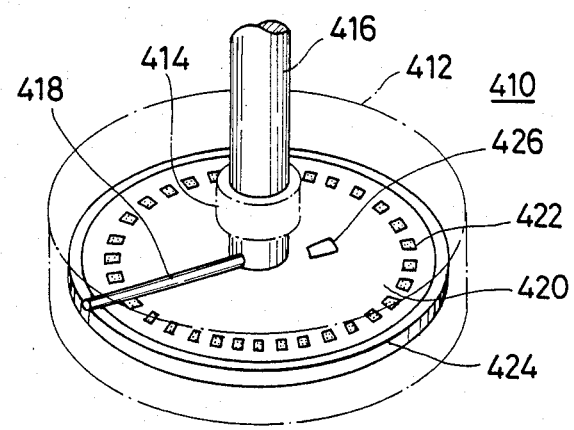
FIG. 32 is a perspective view for a fourth embodiment of the present invention to the rotary encoder.
Figure 33:
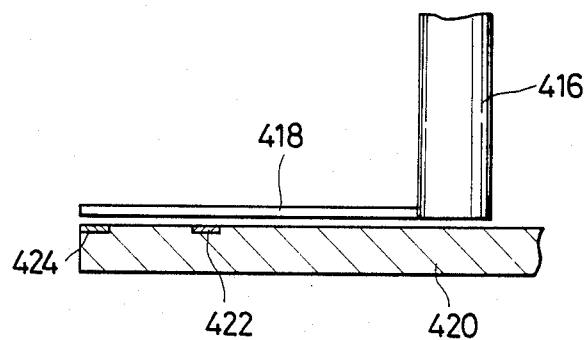
FIG. 33 is a cross-sectional view of the rotary encoder shown in FIG. 32.

As shown in FIGS. 32 and 33, a rotary encoder due to a fourth embodiment in accordance with the present invention is shown with reference numeral 410. The rotary encoder 410 includes a cylindrical case 412 that is shown by the single-chained line in FIG. 32. A rotation shaft 414 that is arranged at the center of the top surface of the cylindrical case supports a rotation shaft 416 that is linked to the rotation of an object to be measured with its axis center to be perpendicular to the top surface. One end of the rotation shaft 414 is held in the case 412, and the rotation shaft 414 supports a needle-shaped rotating member 418 made of conducting material whose one end is fixed to the rotation shaft 416 and whose the other end rotates around the axis center of the rotation shaft 416. Further, on the inside of the bottom surface of the case 412, at the position facing one end of the rotation shaft 416, there is placed a disk-shaped semiconductor chip 420. On the semiconductor chip 420 there are arranged with a predetermined separation a plurality of electrical conductors 422, with their approximately square surfaces exposed on the semiconductor chip 420 made of electrically conducting material, on the circumference of a circle that has its center at the intersecting point of the axis center of the rotation shaft 416 with the semiconductor chip 420. Further, a band-shaped annular electrode 424 made of electrically conducting material is arranged on the semiconductor chip 420, along the periphery of the disk-shaped semiconductor chip 420, approximately concentric to the circle formed by the electric conductors 422. An alternating electric field is applied to the annular electrode 424 by means of a high frequency power source 426 that is actuated by a power unit provided on the semiconductor chip 420 but not shown in the figure. Namely, as shown in FIG. 33, the rotation shaft 416 that rotates together with the object to be measured, causes the rotating member 418 to face the electrical conductor 422 that corresponds to the rotation angle of the object to be measured. In this case, the tip of the rotating member 418 faces also the annular electrode 424 so that the annular electrode, the rotating member 418, and the electrical conductor 422 form a capacitor and hence the alternating electric field that is applied to the annular electrode 424 is transmitted to the electrical conductor 422 that corresponds to the rotation angle. The alternating electric field that is generated in each of the electrical conductors 422 is detected by a signal processing circuit 428, arranged on the semiconductor chip 420, that serves as a coding means, and is converted to a coded signal which is characteristic to each of the electrical conductors 422.

Figure 34:
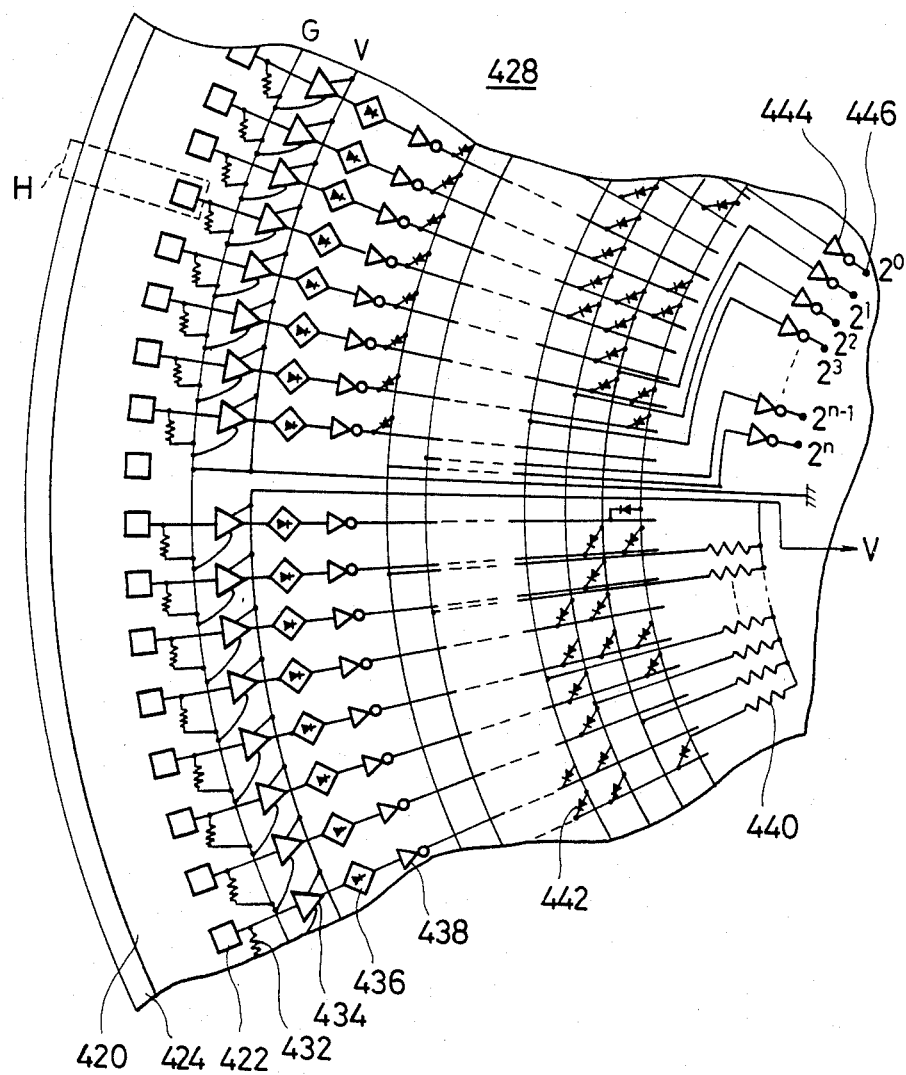
FIG. 34 is a circuit diagram for the signal processing circuit in the rotary encoder shown in FIG. 33.

In what follows a description will be made about the signal processing circuit 428. As shown in FIG. 34 each of the electrical conductors 422 is connected to each of the load resistors 432 that have one of their respective ends connected to the ground 430. Then, by the alternating electric field that is generated in an electrical conductor 422, there is generated an alternating voltage at the juncture of the load resistor 432 and the electrical conductor 422.

Furthermore, each of the electrical conductors 422 is connected respectively to the amplifiers 434 that are provided with a power from the power source V, so that the alternating voltage generated in the electrical conductor 422 is amplified to a predetermined value. The amplified alternating voltage is converted to a direct current by a rectifier 436 and is inverted after binary coded by a NAND circuit 438 that has a Schmitt circuit built in it. The output terminals of the NAND circuits 438 are connected via diodes 442 to some of a plurality of pull-up resistors 440 that have one of their ends connected to the power source V, in combinations that are different for each NAND circuit that corresponds to each electrical conductor 422. These diodes 442 have their anode sides connected to the pull-up resistors 440. Namely, the alternating voltage that is generated due to application of an alternating electric field to the electrical conductor 422 is amplified by the amplifier 434 and is converted to a direct current voltage by the rectifier 436. After binary coded by the NAND circuit 438, it is inverted and a zero output is given. Therefore, the pull-up resistor 440 that is connected via the diode 442 is short-circuited to the ground that is built in the NAND circuit but not shown. All of the voltages of the pull-up resistors 440 during the short-circuiting are led out from between each of the NAND circuits 438 and each of the pull-up resistors 440, or in the case of the pull-up resistors 440 that are connected to the NAND circuits 438 via the diodes 442, from the anode sides of the diodes 442. The voltages are inverted respectively by the NAND circuits 444 and are led to the output terminals 446 for coded signals as positive logic signals. That is, from the output terminal 446 that corresponds to the pull-up resistor 440 that is short-circuited to the ground via the diode 442, there is output a positive logic signal "1". On the other hand, from the output terminal 446 corresponding to the pull-up resistor 440 that is not short-circuited to the ground, there is output a positive logic signal "0". In this fourth embodiment, there is assigned a reflected binary code (Gray code) that corresponds to each of the electrical conductors 422. Each of the NAND circuits 438 and each of the pull-up resistors 440 are connected by the diodes 442 in such a way as to give the reflected binary codes that are assigned to the electrical conductors that received the alternating electric field, from each of the output terminals 446 as coded signals. Here, each of the output terminals 446 corresponds respectively to each of the digits of the reflected binary codes "$2^0$, $2^1$, $2^2$, ..., $2^{n-1}$, $2^n$".

For instance, if the rotating member 418 is led by the rotation shaft 416 to the region H that is surrounded by the dotted line in FIG. 34, the alternating electric field that is applied to the annular electrode 424 is applied via the rotating member 418 to the electrical conductor 422 that faces the rotating member 418, and is grounded via the resistor 432. The alternating voltage generated in the electrical conductor 422 is amplified by the amplifier 434, rectified by the rectifier 436, binary coded in the NAND circuit 438, and inverted to produce a zero output . In this way, the pull-up resistor 440 connected to the output terminal of the NAND circuit 438 via the diode 442 is short-circuited to the ground. Therefore, each of the NAND circuits 444 outputs a positive logic coded signal from an output terminal 446 by inverting the input negative logic signal to a positive logic signal. In this case, a set of coded signals that are output from each of the output terminals 446, is "0110 . . . 01" in which each digit corresponds successively to each digit of the reflected binary codes "$2^0, 2^1, 2^2, \ldots, 2^{n-1}, 2^n$".

In this manner, it is possible to specify the electrical conductor 422 that received an alternating electric field, based on a set of reflected binary codes that consists of coded signals output from the respective output terminals 446. Therefore, it is possible to specify also the position of the rotating member 418 that applied the alternating electric field to the electrical conductor 422, in other words, the position of the rotating member that rotates, linked to the rotation of the object to be measured, facing successively each of the electrical conductors 422. Hence, according to the rotary encoder of the present embodiment, the angle of rotation of the object to be measured can be detected in absolute value with high precision, from the coded signals that are output from the output terminals.

The rotary encoder in the above which represents an embodiment of the present invention may be modified and limited in various ways without departing from the technical ideas of the present invention. Thus, for instance, in the embodiment, the NAND circuits 438 and the pull-up resistors 440 are connected via diodes 442. However, the diodes may be replaced by plain lead wires, and instead, one diode may be connected to each of the pull-up resistor to take out negative logic signals from these junctures. Further, the effects of the present embodiment will not be diminished by omitting amplifiers 434, or rectifiers 436, or still further, NAND circuits 438 depending upon the conditions of the alternating electric field that is generated in the electrical conductor 422. Moreover, the frequency of the alternating electric field that is to be applied to the annular electrode 424 which is determined by the various conditions possessed by the annular electrode 424, the rotating member 418, and the electrical conductors 422 that constitute a capacitor, should be selected as most efficient in response to these various conditions.

Figure 35:
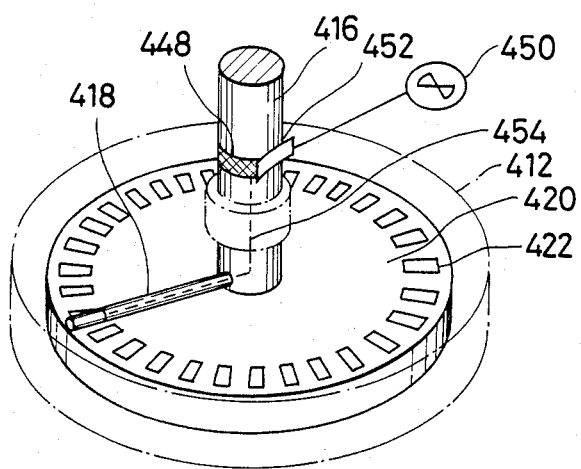
FIG. 35 is a cross-sectional view for illustrating a modification to the displacement detection unit in the fourth embodiment shown in FIG. 33.

Still further, the alternating electric field that is applied to the annular electrode 424 in the present embodiment may be applied instead to the rotating member 418 as shown in FIG. 35 (with identical parts given identical symbols). In that case, the annular electrode is removed, and instead, there are added a conductive band 448 that is wound around the rotating shaft 416, a contact piece 452 contacting the band 448, to which is applied a high frequency alternating electric field that is supplied by a high frequency power source 450, and a lead wire 454 shown by dotted line in the figure, for transmitting the applied high frequency alternating electric field to the rotating member 418. Here alternating electric field is applied to the rotating member 418, by making only its portion that faces the electrical conductors with electrically conducting material.

Figure 36:
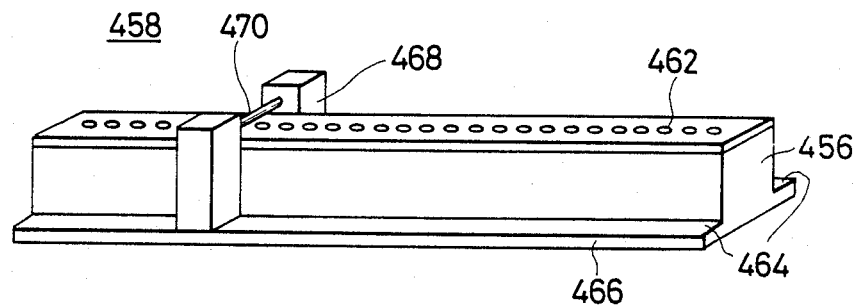
FIG. 36 is a perspective view for illustrating the construction of the case in which the fourth embodiment in accordance with the present invention is applied to the linear encoder.

Next, an example of applying the displacement detector of the present invention to a linear encoder 460 will be described. As shown in FIG. 36, the linear encoder 458 comprises a pillar body 460 made of a nonconducting slender rectangular bar, a plate-like semiconductor chip having a rectangular surface that makes a close contact just sufficiently with the top surface of the pillar body 460 in its longitudinal direction, electrodes 462 that consist of numerous exposed elliptically shaped electrical conductors that are arranged in a row with predetermined separation along a straight line in the longitudinal direction of the semiconductor chip, a base board 466 with a rectangular plane that is fixed to a plane that faces the above-mentioned top surface, with flanges formed on both sides along the longitudinal direction of the pillar body 460, a needle 470 with its both ends supported by two nonconducting supporting bodies 468 that are placed on the flanges of the base board 466, with the pillar body 460 in between, so as to slide in the longitudinal direction, facing successively to the electrodes 462 by the motion of the supporting bodies 468, and is supplied an alternating electric field from a high frequency power source that is not shown, and a signal processing unit which represents an encoder that is integrated on the semiconductor chip for outputting coded signals characteristic to each of the electrodes 462, by detecting the electrode 462 to which is applied an alternating electric field. With this construction, the alternating electrical field applied to the needle 470 will be transmitted to the electrode 462 that faces the needle 470 that moves in response to the position of the supporting bodies that are linked to the object to be measured. From the electrode 462 which received the alternating electric field, there is output a coded signal that is characteristic to the electrode 462, by the signal processing circuit. Therefore, it is possible to specify the electrode which received the alternating electric field, based on the coded signal received. Accordingly, the position of the needle 470 that faces the electrode to which is applied the alternating electric field, namely, the position of the object to be measured that moves on a straight line linked to the mobile supporting bodies 468, can be specified in absolute value from the coded signal. Here, the construction of the signal processing circuit is the same as the signal processing circuit that was used in the rotary encoder. In this way, the embodiment of the present invention and its modifications described above involves no reading errors between the light-receiving elements, as they occur in a rotary encoder of photoelectric type. In addition, it is possible, for equal resolution, to reduce the device volume substantially compared with the case of a device of photoelectric type, and it becomes unnecessary to cover the entire device with a container that is highly air tight in order to shield the external disturbing light that may become the cause of malfunctions. Therefore, the embodiment and the modifications show superior characteristics in regard to reliability and environment-proof, shock-proof, and noise-proof properties.

As in the foregoing, the displacement detector of the present invention has been described in conjunction with certain embodiments, but various modifications to them can be realized without departing from the technical ideas of the present invention. Thus, for instance, the conversion circuit for generating the coded signals can be formed as a custom-made IC by integrating the entire system. Further, to change the coded signals that are output from the conversion circuit as reflected binary codes to something else, for example, as binary coded output or logarithmic output, the connection of the diodes that connects the pull-up resistor and the NAND circuit may be changed to connection of other disposition. Moreover, the number of electrodes that are arranged in a row with predetermined spacing on the semiconductor chip may be increased as much as possible in order to obtain a desired detection precision. In that case, the number of output terminals will have be increased in proportion to the improvement in the detection precision. Adding still more, the circuit elements such as the conversion circuit, the annular electrode, and the electrical conductors that are to be arranged on the semiconductor chip may be formed according to the ordinary manufacturing process that is employed for forming integrated circuits.

As in the above, in the various embodiments and their modifications for realizing the displacement detector of the present invention, the form of each parts, namely, the constructions of the important parts, may be changed arbitrarily without imposing any unnecessary restrictions as long as their essential functions are preserved.

According to the fourth embodiment above, there is output a coded signal which is characteristic to each of the electrical conductors that corresponds to the conductor in which is induced an alternating voltage. Such a voltage is generated by the alternating electric field that is applied by the alternating electric field applying means that moves along the electrical conductors that are arranged with predetermined spacing, so that the displaced amount of the object to be measured can be detected in absolute value with high precision.

In summary, according to the present invention, it is possible to output a signal which is characteristic to a light-emitting element that outputs the light, in response to the detection by the light-receiving element of the light that is output by the light-emitting element. Therefore, it becomes possible to carry out rapid detection with high precision of the absolute displaced position, by the use of a small-sized displacement detector.

What is claimed is:

1. A displacement detector for detecting the amount of displacement of an object to be measured, comprising:

sensing means that are disposed with predetermined spacing, whose states change in response to changes in input electromagnetic energy;

electromagnetic energy varying means which is arranged movably, linked to motion of the object to be measured, along a row of said sensing means in order to vary an amount of electromagnetic energy in said sensing means in response to a displaced amount of the object to be measured; and a signal processing circuit for converting a detector signal that is obtained from said sensing means situated at a position where the electromagnetic energy is changed by said electromagnetic energy varying means, to a coded signal which is characterized to the position of the sensing means at the position where there was a change in the electromagnetic energy, and for outputting the coded signal as a displacement detection signal;

wherein said sensing means comprises a plurality of light receiving elements, said signal processing circuit comprises diode groups for generating signals that are characteristic of each of the plurality of light-receiving elements, based on the output obtained from a specified light-receiving element, a power source that is connected in series to the diode groups via load resistors, and NOT circuits that invert digital output signals from the respective load resistors that are short-circuited via the diode groups to output them as said coded signal representative of a displacement signal, based on the output from the specified light-receiving element.

2. A displacement detector as claimed in claim 1, in which said displacement detector comprises a rotary encoder for detecting the displaced amount in rotation of the object to be measured.

3. A displacement detector as claimed in claim 2, in which the electromagnetic energy comprises light energy, said sensing means comprises a plurality of light-receiving elements that are arranged in circular form with predetermined spacing, and said electromagnetic energy varying means comprises a light-emitting element as a light source for radiating light arranged on a center of a rotating shaft of the object to be measured, and a light transmitting means, linked to circular motion of the object to be measured, for transmitting light from the light source to the light-receiving element that is located at the position that corresponds to the displacement of the object to be measured.

4. A displacement detector as claimed in claim 3, in which the light-receiving elements, the light-emitting element, and the signal processing circuit are arranged distributed on a disk-like semiconductor chip.

5. A displacement detector as claimed in claim 3, in which the light transmitting means of said electromagnetic energy varying means comprises a prism that is provided on the object to be measured in order to transmit the light from the light-emitting element by reflection to the light-receiving element.

6. A displacement detector as claimed in claim 3, in which the light transmitting means of said electromagnetic energy varying means comprises an optical fiber that is provided on the object to be measured for transmitting the light from the light-emitting element to the light-receiving element.

7. A displacement detector as claimed in claim 1, in which said signal processing circuit further includes a trouble shooting until that diagnoses malfunctions by examining whether or not the change in the displacement detection signal is within a predetermined range of values.

8. A displacement detector as claimed in claim 7, in which the trouble shooting unit comprises a register for memorizing the digital signals from the load resistors, EXCLUSIVE-OR circuits for taking logical difference by comparing the values from the register for a preceding state and digital values obtained from the load resistors for a present state, load resistors with equal weight for D/A converting outputs from the EXCLUSIVE-OR circuits and a comparator for comparing a DC voltage from the load resistors and a voltage that corresponds to a change in one digit of the displacement detection signal.

9. A displacement detector is claimed in claim 1, in which said signal processing circuit further includes a rotation number measuring unit that counts a number of rotations of the object to be measured.

10. A displacement detector as claimed in claim 9, in which the rotation number, measuring unit comprises a flip-flop whose set and reset terminals are connected to two light-receiving elements, AND circuits for obtaining logical sums of signals from Q and $\overline{Q}$ terminals of a flip-flop and signals from light-receiving elements other than the above two, and an up-down counter for counting an output signal from the AND circuits.

11. A displacement detector as claimed in claim 1, in which said signal processing circuit further includes a maximum value screening unit which screens a sensor output with maximum value when light is incident upon a plurality of light-receiving elements.

12. A displacement detector as claimed in claim 11, in which said maximum value screening unit comprises comparators that compare outputs of both of adjacently situated light-receiving elements, inverters that invert outputs of adjacent comparators in a preceding stage, and NAND circuits for NANDing outputs from the comparator and a output from the inverter.

13. A displacement detector as claimed in claim 1, in which the electromagnetic energy comprises light energy, said sensing means comprises a plurality of light-receiving elements that are arranged in a row in linear form with predetermined spacing, and said electromagnetic energy varying means comprises a light-emitting element provided on the object to be measured for radiating light, linked to a linear motion of the object to be measured.

14. A displacement detector as claimed in claim 3, in which the light-receiving element comprises a phototransistor or a photodiode and the light-emitting element comprises a light-emitting diode or a laser diode.

15. A displacement detector as claimed in claim 1, in which said signal processing circuit further includes a parity checking circuit which outputs parallel coded signals that are output from the load resistors by converting them to series coded signals.

16. A displacement detector as claimed in claim 2, in which the electromagnetic energy comprises light energy, said sending means comprises an annular magnet that has the axis center of the rotation shaft of the object to be measured as the center of the annulus and a plurality of magnetic sensors that are arranged with predetermined spacing in circular form along the annular magnet, and said electromagnetic energy varying means comprises a magnetic needle that moves over the magnetic sensors, linked to the circular motion of the object to be measured.

17. A displacement detector as claimed in claim 16, in which the magnetic sensors and the signal processing circuit are arranged on a disclike semiconductor chip.

18. A displacement detector as claimed in claim 1, in which the electromagnetic energy comprises magnetic energy, said sensing means comprises a bar magnet and a plurality of magnetic sensors that are arranged side by side in a straight line with predetermined spacing along the bar magnet, and said electromagnetic energy varying means comprises a magnetic needle that moves over the magnetic sensors, linked to the linear motion of the object to be measured.

19. A displacement detector as claimed in claim 2, in which the electromagnetic energy comprises electric energy, said sensing means comprises a plurality of electrical conductors that are arranged side by side with predetermined spacing on the circumference of a circle with its center at the position where the axis center of the rotation shaft of the object to be measured interrects the semiconductor chip, and said electromagnetic energy varying means comprises a needle-like rotating member made of electrically conducting material that moves over the electrical conductors linked to the circular motion of the object to be measured.

20. A displacement detector as claimed in claim 19, in which the electrical conductors and the signal processing circuit are arranged on a disc-like semiconductor chip.

21. A displacement detector as claimed in claim 1, in which the electromagnetic energy comprises electrical energy, said sensing means comprises a plurality of electrical conductors that are arranged side by side with predetermined spacing in a straight line, and said electromagnetic energy varying means comprises an electrically conducting needle that moves over the electrical conductors, linked to the linear motion of the object to be measured.

22. A displacement detector for detecting the amount of displacement of an object to be measured, comprising:
a plurality of light-emitting elements that are arranged side by side with predetermined spacing;
a flashing circuit for flashing successively the light-emitting elements and for outputting successively signals that are characteristic to each of said light-emitting elements;
a light-receiving element for detecting light from said light-emitting elements;
light transmitting means for transmitting the light from said light-emitting elements to said light-receiving element by moving along the line of said light-emitting elements, linked to the object to be measured; and
a signal processing circuit for outputting said signals that are output successively from said flashing circuit, in response to the detection signal from said light-receiving element,
said signal processing circuit comprises counter means for storing a count value corresponding to the plurality of light-emitting elements, and register means for holding the count value of the counter means in response to a signal from the light-receiving element and outputting a digital output signal that corresponds to the count value which represents an angle signal which is representative of an annular displacement of the object to be measured.

23. A displacement detector as claimed in claim 22, in which said displacement detector comprises a rotary encoder for detecting the amount of rotational displacement of the object to be measured.

24. A displacement detector as claimed in claim 23, in which said light-emitting elements are arranged side by side on the circumference of a circle with its center at the position where the axis center of the rotation shaft intersects the semiconductor chip, and said light-receiving element is arranged on the axis center of the rotation shaft of the object to be measured.

25. A displacement detector as claimed in claim 24, in which said light transmitting means comprises a prism provided on the object to be measured, for transmitting the light from said light-emitting elements to said light-receiving element by reflection.

26. A displacement detector as claimed in claim 24, in which said light transmitting means comprises optical fibers provided on the object to be measured, for transmitting the light from said light-emitting elements to said light-receiving element.

27. A displacement detector as claimed in claim 23, in which said light-emitting elements, light-receiving element, flashing circuit, and signal processing circuit are arranged on a disc-shaped semiconductor chip.

28. A displacement detector for detecting the amount of displacement of an object to be measured, comprising:

sensing means that are arranged with predetermined spacing, whose states change in response to the changes in the electromagnetic energy;

electromagnetic energy generating means for generating electromagnetic energy;

electromagnetic energy transmitting means that is linked to the object to be measured, for transmitting the electromagnetic energy from the electromagnetic energy generating means to the sensing means at the position that corresponds to the displacement of the object to be measured;

a conversion unit for outputting, as a displacement detection signal, the detection signal obtained from said sensing means that is situated at the position where the electromagnetic energy is changed by said electromagnetic energy generating means, by converting the detection signal to a coded signal that is characteristic corresponding to the position of the sensing means for the position where a change in the electromagnetic energy took place;

a trouble shooting unit for diagnosing malfunctions by examining whether or not the change in the displacement detection signal from said conversion unit is within the range of specified values;

a rotation number measuring unit for counting the number of rotations of the object to be measured based on the detection signal from said sensing means; and a maximum value screening unit for screening the maximum value from among the sensor outputs, when the electromagnetic energy impinges upon a plurality of sensing means.

* * * * *